(12) United States Patent
Aoki et al.

(10) Patent No.: US 9,032,996 B2
(45) Date of Patent: May 19, 2015

(54) SHAFT SEALING DEVICE AND VALVE STRUCTURE USING THE SAME

(71) Applicant: KITZ CORPORATION, Chiba (JP)

(72) Inventors: Kazuhiro Aoki, Yamanashi (JP);
Tomoya Yamasaki, Yamanashi (JP);
Chikashi Gomi, Yamanashi (JP)

(73) Assignee: KITZ CORPORATION, Chiba (JP)

(*) Notice: Subject to any disclaimer, the term of this patent is extended or adjusted under 35 U.S.C. 154(b) by 84 days.

(21) Appl. No.: 14/036,408

(22) Filed: Sep. 25, 2013

(65) Prior Publication Data

US 2014/0013938 A1     Jan. 16, 2014

Related U.S. Application Data

(62) Division of application No. 12/451,299, filed as application No. PCT/JP2008/061259 on Jun. 19, 2008, now abandoned.

(30) Foreign Application Priority Data

Jun. 19, 2007   (JP) .................... 2007-160880
Oct. 9, 2007    (JP) .................... 2007-263755

(51) Int. Cl.
*F15B 21/00*   (2006.01)
*F16J 15/16*   (2006.01)
(Continued)

(52) U.S. Cl.
CPC .............. *F15B 21/00* (2013.01); *G05D 7/0641* (2013.01); *G05D 7/0635* (2013.01); *F16J 15/164* (2013.01);
(Continued)

(58) Field of Classification Search
CPC . G05D 7/0635; G05D 7/0641; G05D 7/0652; G05D 7/0647
USPC .......... 251/129.06; 137/67, 596, 596.17, 829, 137/831
See application file for complete search history.

(56) References Cited

U.S. PATENT DOCUMENTS 3,981,480 A      9/1976  Eernisse et al.
4,298,181 A  *  11/1981  Corrado et al. .......... 251/129.06
(Continued)

FOREIGN PATENT DOCUMENTS

JP      4-362375       12/1992
JP      3501216        12/2003
JP      2007-120737    5/2007

OTHER PUBLICATIONS

International Search Report issued Sep. 16, 2008 in International Application No. PCT/JP2008/061259.
(Continued)

*Primary Examiner* — Craig Schneider
*Assistant Examiner* — Christopher Ballman
(74) *Attorney, Agent, or Firm* — Wenderoth, Lind & Ponack, L.L.P.

(57) ABSTRACT

A shaft sealing device switches a sealing state and an unsealing state of a fluid, with high sealing performance maintained, because no abrasion accompanies movement of a sealing material or a sealing member, enabling feeding a fluid at a predetermined flow rate, and adjusts the expanding rate of the sealing material with the quantity of an external electric signal and accordingly adjusts the contact face pressure to enable controlling the amount of leakage of the fluid highly precisely, so that it can be used for all applications. The shaft sealing device includes a shaft sealing body formed of a macromolecular material and made expansible or contractible, or deformable, through external electrostimuli applied to a shaft sealing portion disposed in a device body, and flow passages disposed in the shaft sealing portion for feeding the fluid leaked due to the expansion or contraction, or the deformation, of the shaft sealing body.

5 Claims, 34 Drawing Sheets

(51) Int. Cl.

| | | |
|---|---|---|
| *F16J 15/32* | (2006.01) | |
| *F16J 15/56* | (2006.01) | |
| *F16K 7/04* | (2006.01) | |
| *F16K 31/02* | (2006.01) | |
| *G05D 7/06* | (2006.01) | |
| *H01L 41/193* | (2006.01) | |

(52) U.S. Cl.
CPC .......... *F16J 15/3208* (2013.01); *F16J 15/3296* (2013.01); *F16J 15/56* (2013.01); *F16K 7/045* (2013.01); *F16K 31/02* (2013.01); *H01L 41/193* (2013.01); *F16K 31/025* (2013.01)

(56) References Cited

U.S. PATENT DOCUMENTS

| | | |
|---|---|---|
| 4,340,083 A | 7/1982 | Cummins |
| 4,842,017 A | 6/1989 | Reynolds |
| 5,050,838 A | 9/1991 | Beatty et al. |
| 5,085,400 A * | 2/1992 | Petersen ................ 251/129.06 |
| 5,588,717 A * | 12/1996 | Kim et al. .................... 303/84.2 |
| 6,102,897 A * | 8/2000 | Lang ............................ 604/246 |
| 6,247,493 B1 * | 6/2001 | Henderson ................ 137/487.5 |
| 6,439,539 B1 * | 8/2002 | Powell ............................ 251/87 |
| 6,561,479 B1 * | 5/2003 | Eldridge ......................... 251/11 |
| 6,702,301 B1 | 3/2004 | Davies et al. |
| 6,856,073 B2 | 2/2005 | Bryant et al. |
| 7,063,268 B2 | 6/2006 | Chrysler et al. |
| 7,205,732 B1 * | 4/2007 | Gold ............................ 318/142 |
| 7,320,457 B2 * | 1/2008 | Heim et al. .............. 251/129.06 |
| 2007/0075286 A1 * | 4/2007 | Tanner .................... 251/129.06 |
| 2008/0149183 A1 * | 6/2008 | Peeters et al. .................. 137/13 |

OTHER PUBLICATIONS

English translation for German Patent No. 3723287 A1 issued Jan. 26, 1989.

\* cited by examiner

Fig. 14

| Kind of macro-molecular material | Mode of defor-mation | Device ope-ration | Power source | Material behavior | Operating state (holder attached) | Operating state (holder and separator attached) |
|---|---|---|---|---|---|---|
| Electro stimuli-responsive macromolecular material (Dielectric elastomer) | Deformation | NO | ON | 20A | 20A | 20A  35A |
| | | | OFF | 20A | 20A | 20A  35A |
| Electroconductive macromolecular material | Expansion or contraction | NC | ON | 20B | 20B | 35B  20B |
| | | | OFF | 20B | 20B | 20B  35B |
| Ionically conductive macromolecular material | Expansion or contraction | NC | ON | 20C | 20C | |
| | | | OFF | 20C | 20C | |

Fig. 15
| Kind of macro-molecular material | Mode of deformation | Device operation | Power source | Material behavior |
|---|---|---|---|---|
| macro-molecular material | Deformation | NC | ON |  |
| | | | OFF |  |

Fig. 16
(a)
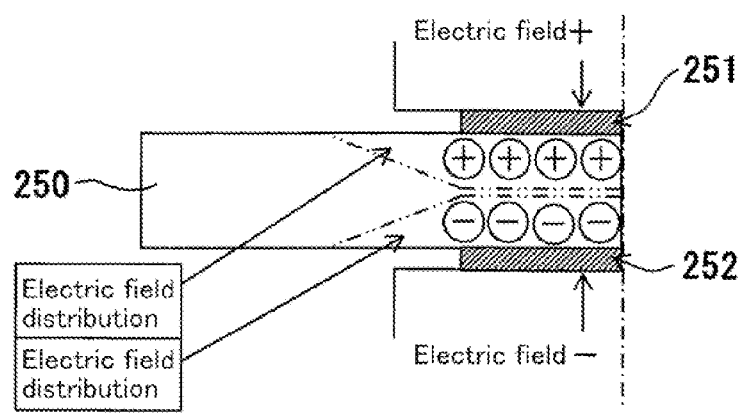
(b)
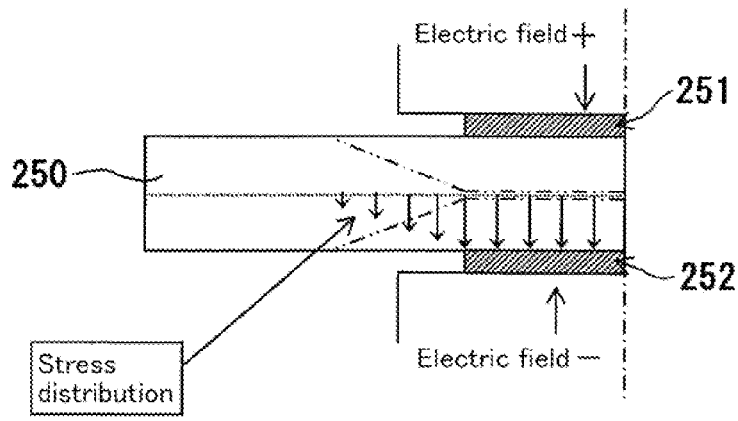
(c)
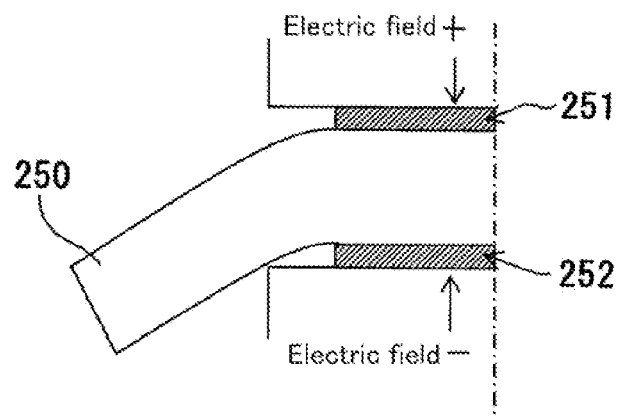

Fig. 17
(a)
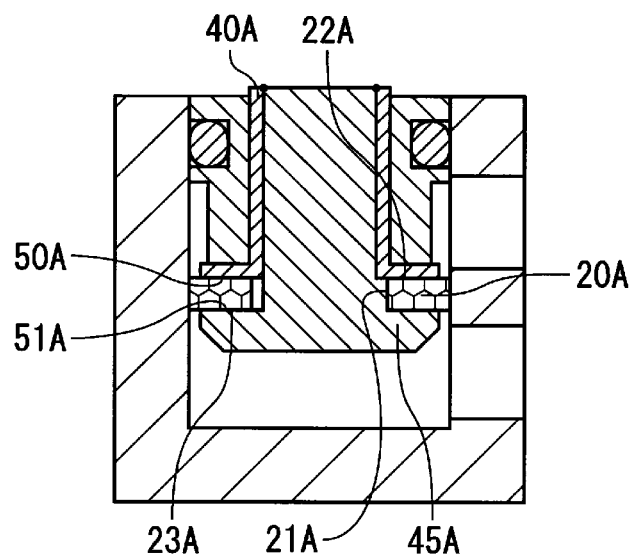
(b)
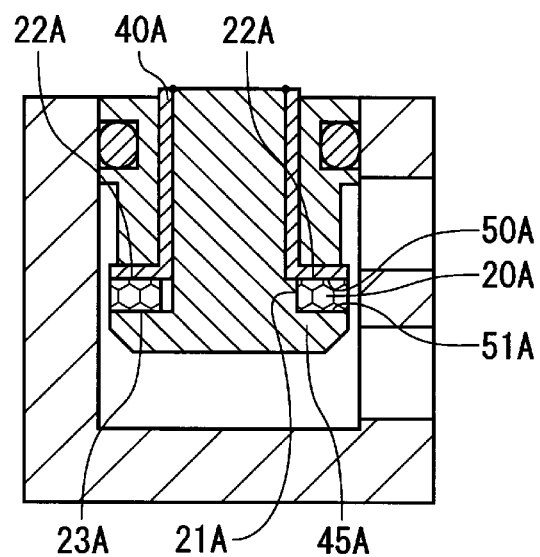

Fig. 18
(a)
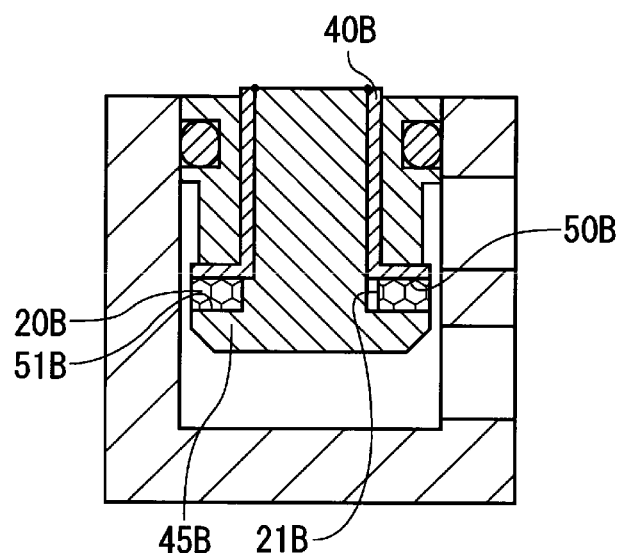
(b)
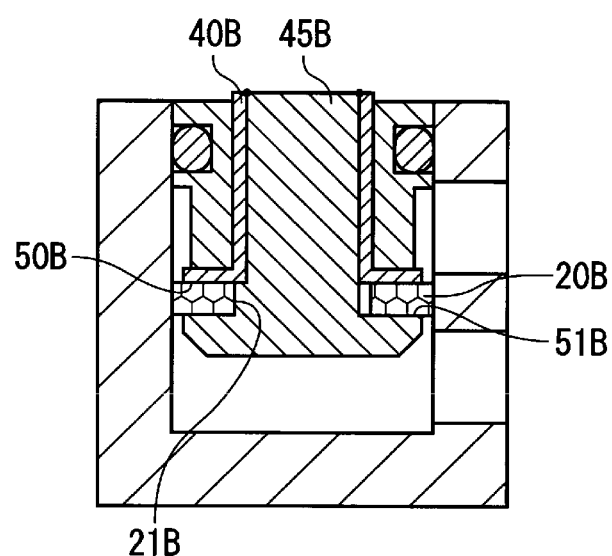

Fig. 19
(a)
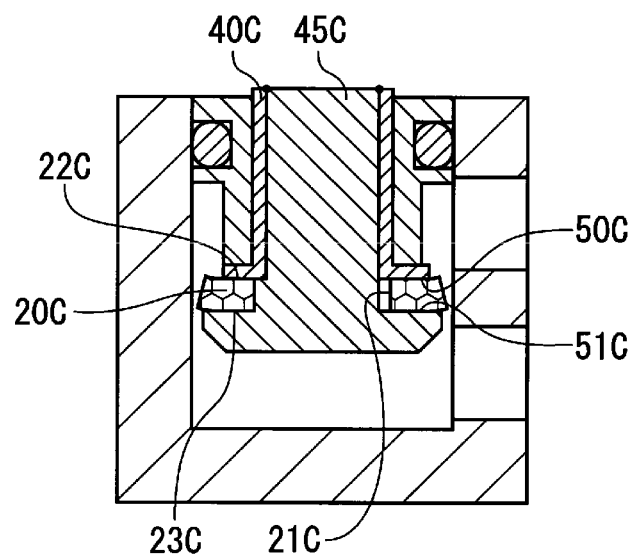
(b)
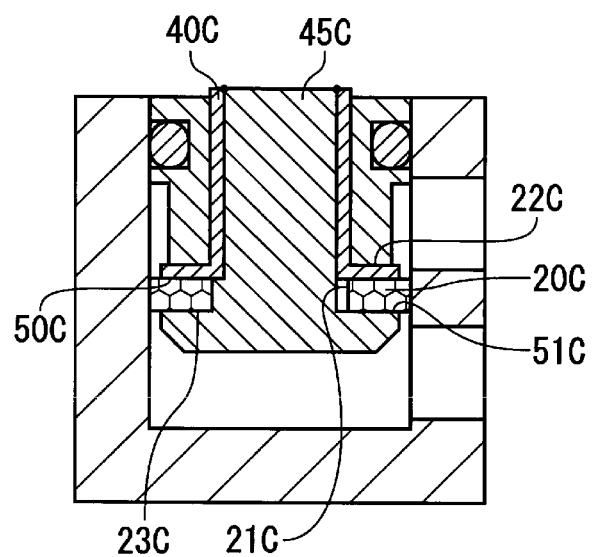

Fig. 20
(a)
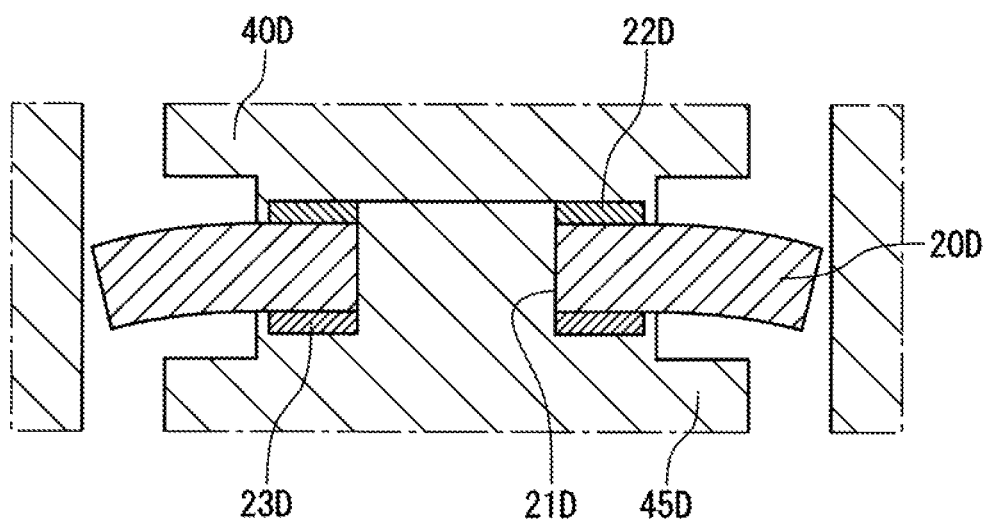
(b)
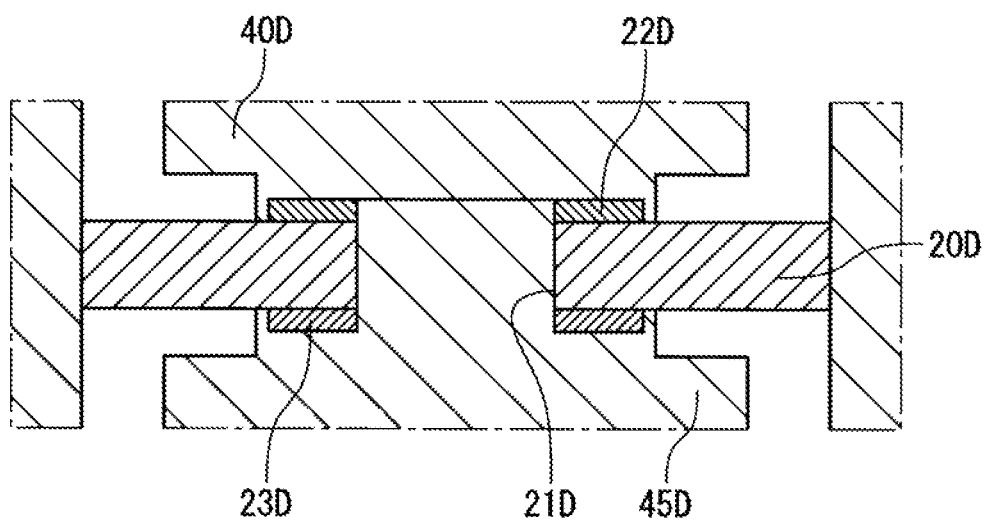

Fig. 21
(a)
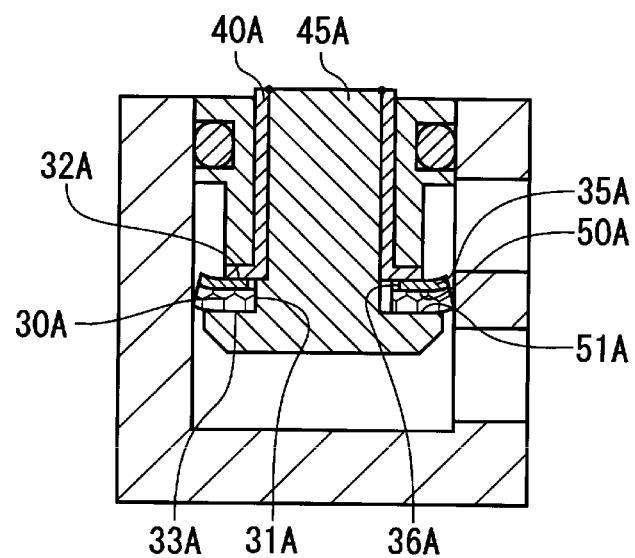
(b)
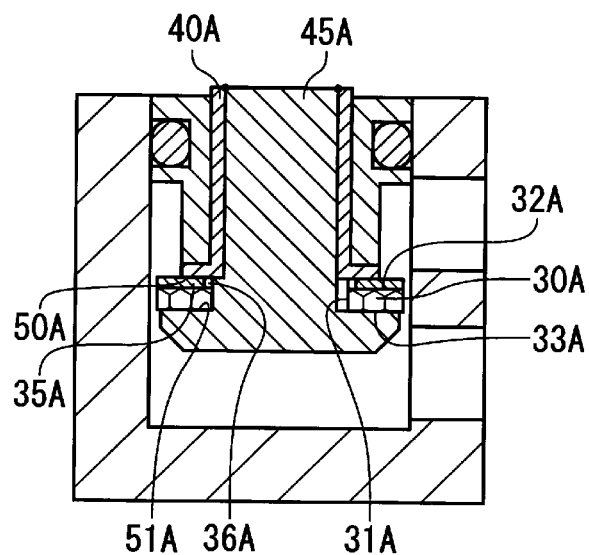

Fig. 22
(a)
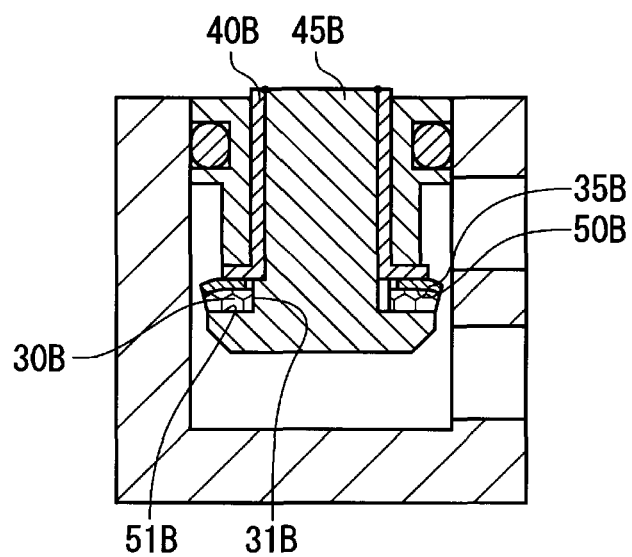
(b)
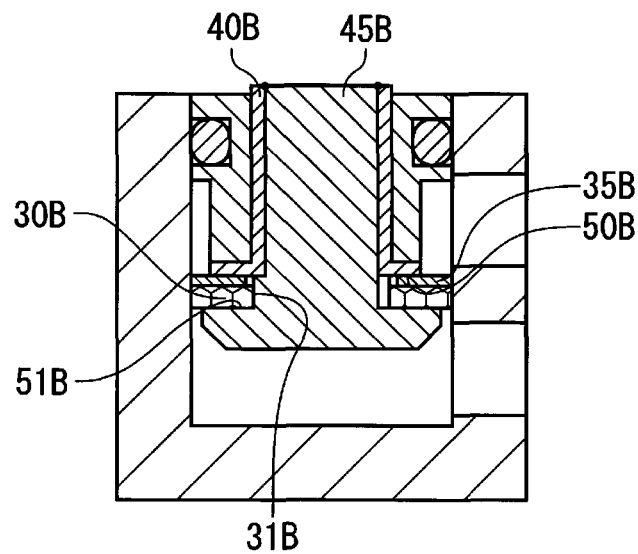

Fig. 23

| Kind of macro-molecular material | Mode of deformation | Device operation | Power source | Material behavior | Operating state (Outer peripheral separator) | Device operation | Operating state (Inner peripheral separator) |
|---|---|---|---|---|---|---|---|
| Electro stimuli-responsive macromolecular material (Dielectric elastomer) | Deformation | NO | ON | 160A | 168A  160A | | |
| | | | OFF | 160A | 160A  168A | | |
| Electroconductive macromolecular material | Expansion or contraction | NC | ON | 160B | 168B  160B | NO | 160B  168B |
| | | | OFF | 160B | 160B  168B | | 160B  168B |
| Ionically conductive macromolecular material | Expansion or contraction | NC | ON | 160C | 160C | | |
| | | | OFF | 160C | 160C | | |

Fig. 24
(a)
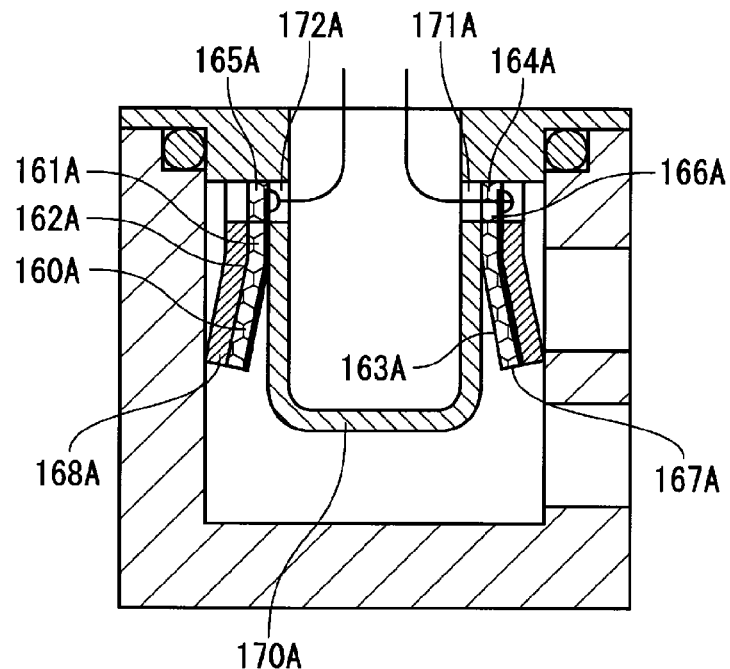
(b)
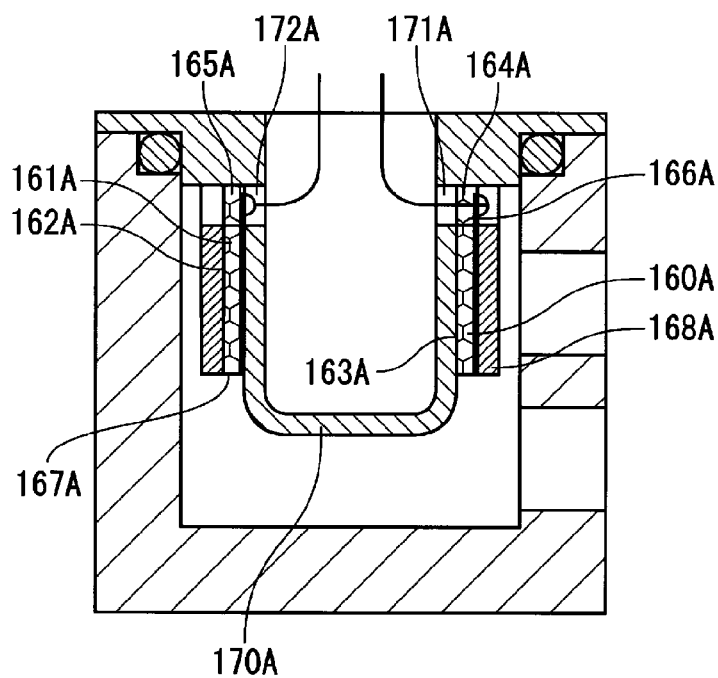

Fig. 25
(a)
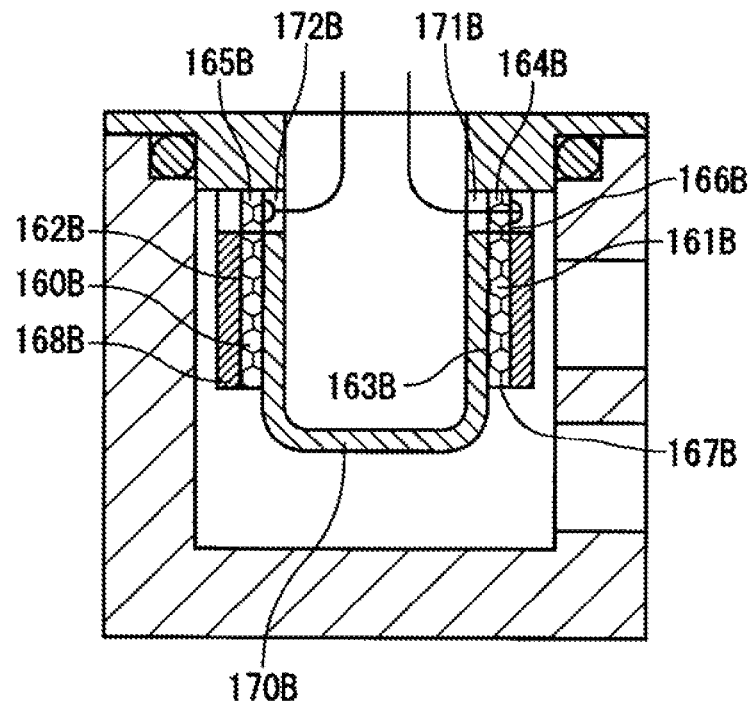
(b)
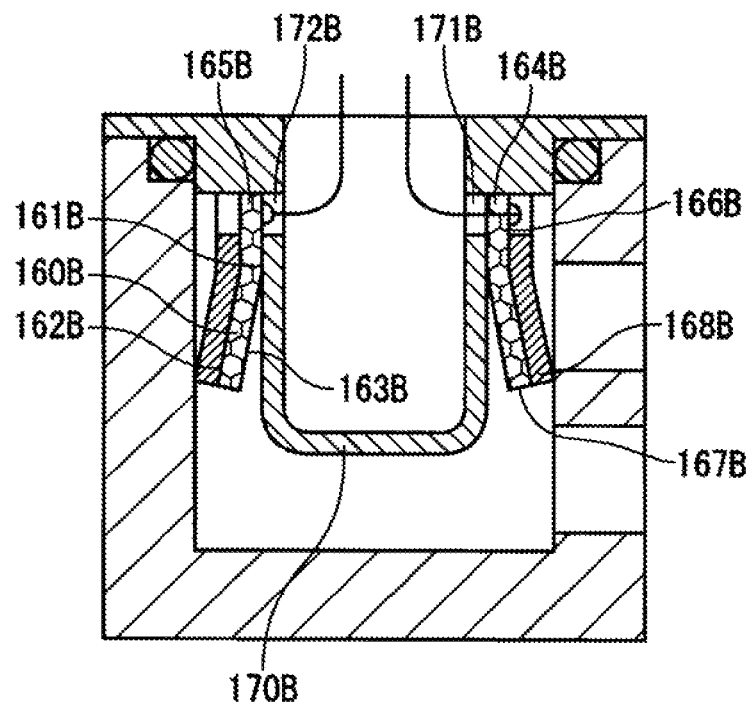

Fig. 26
(a)
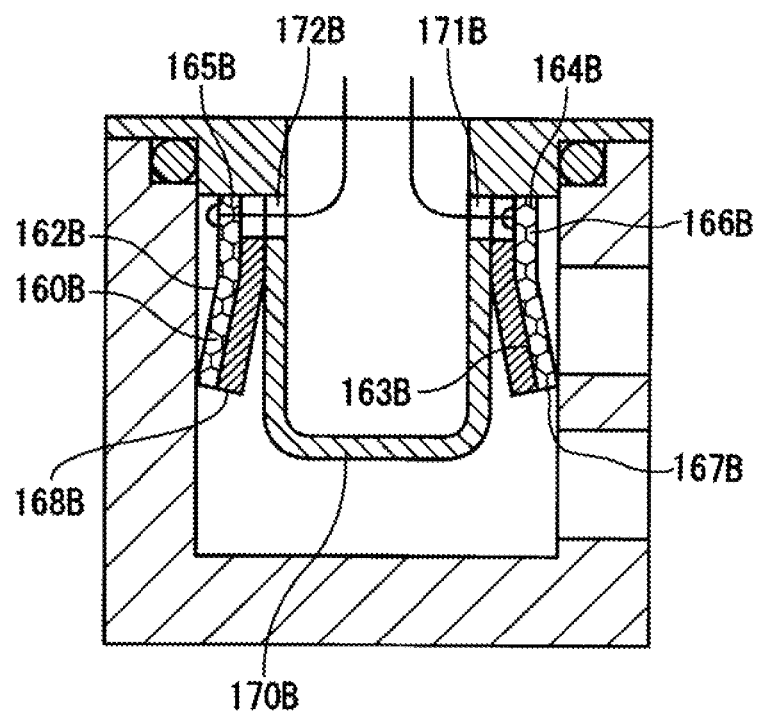
(b)
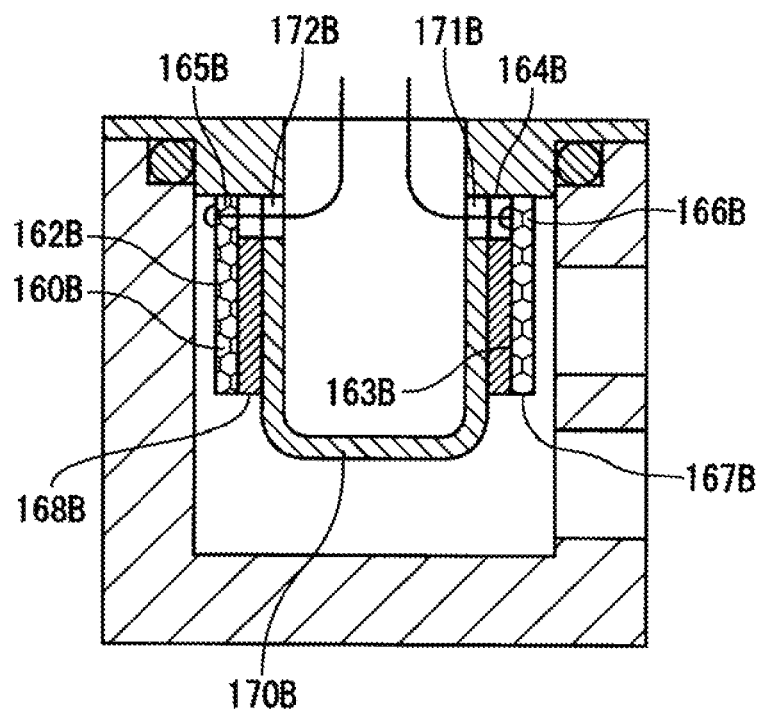

Fig. 27
(a)
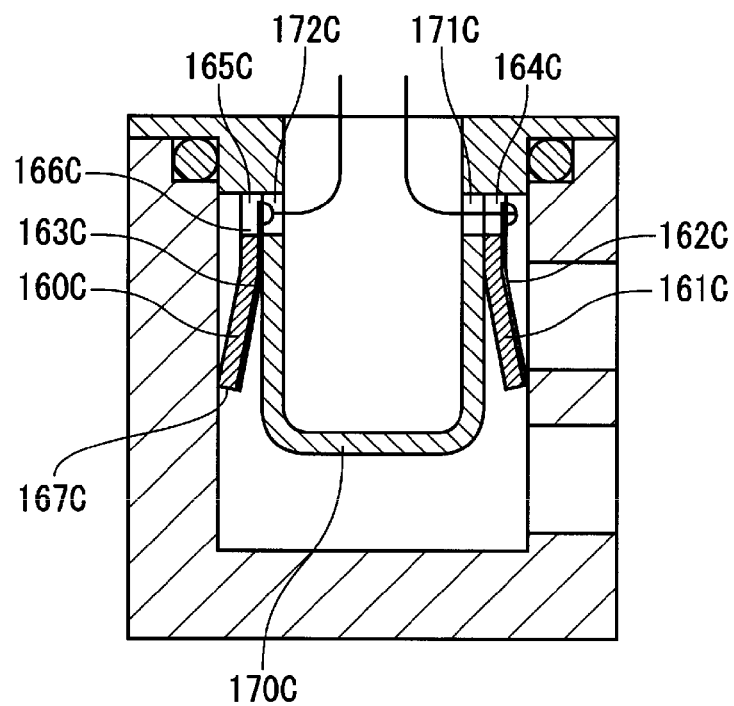
(b)
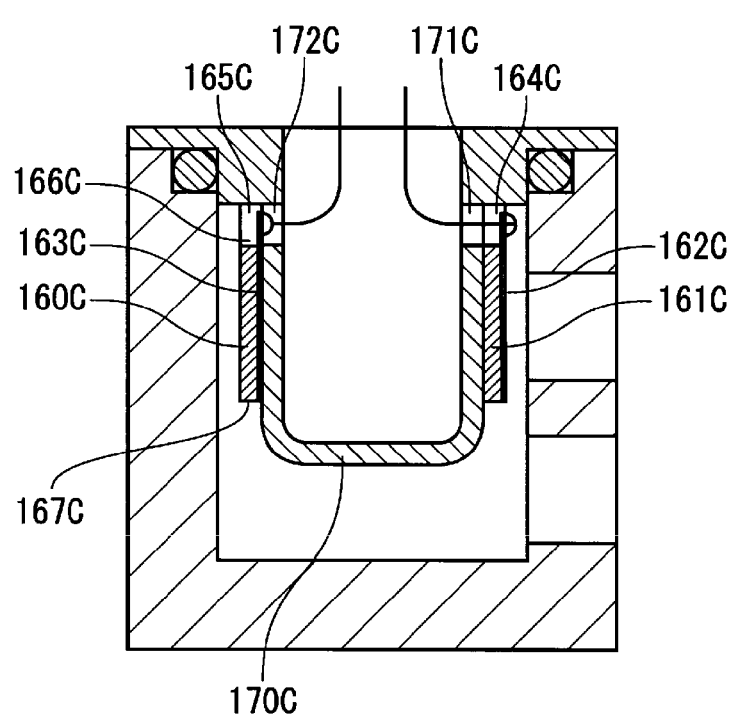

Fig. 30
(a)
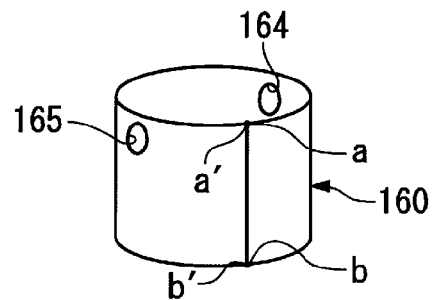
(b)
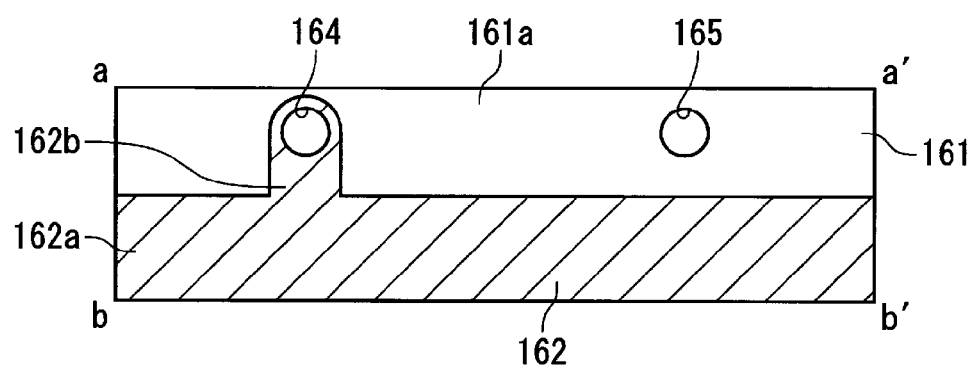
(c)
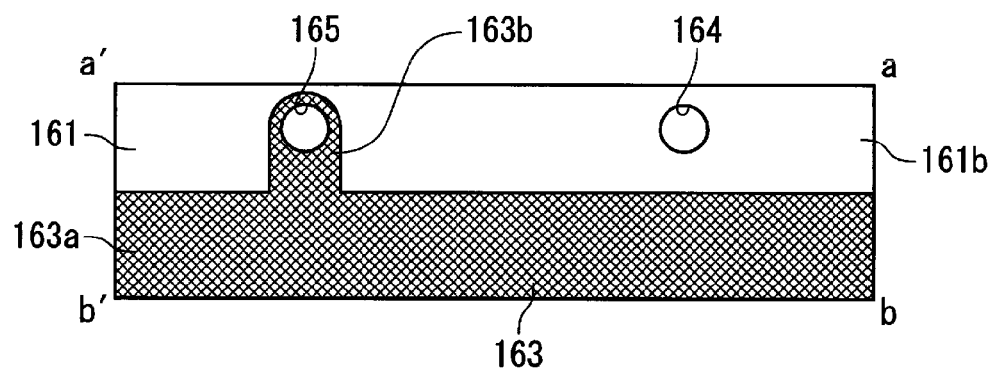

Fig. 33
(a)
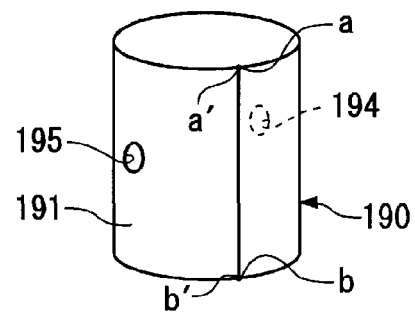
(b)
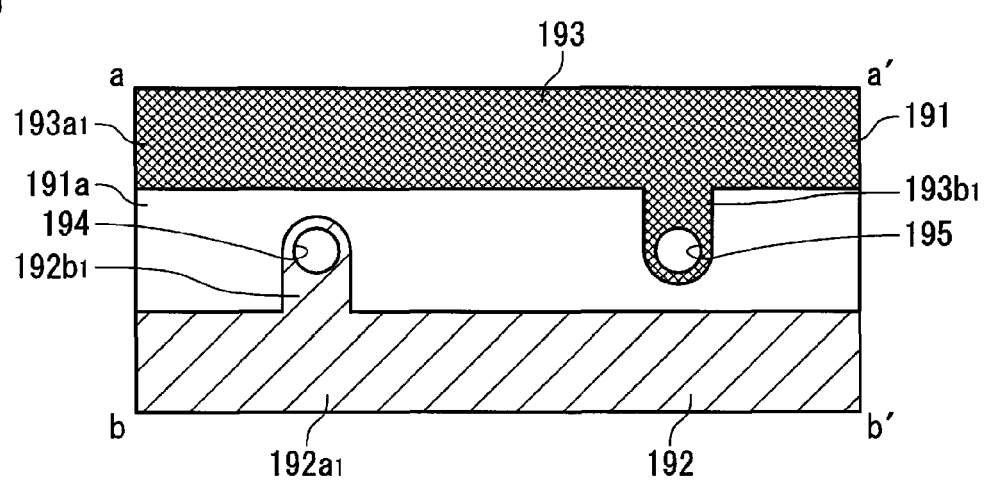
(c)
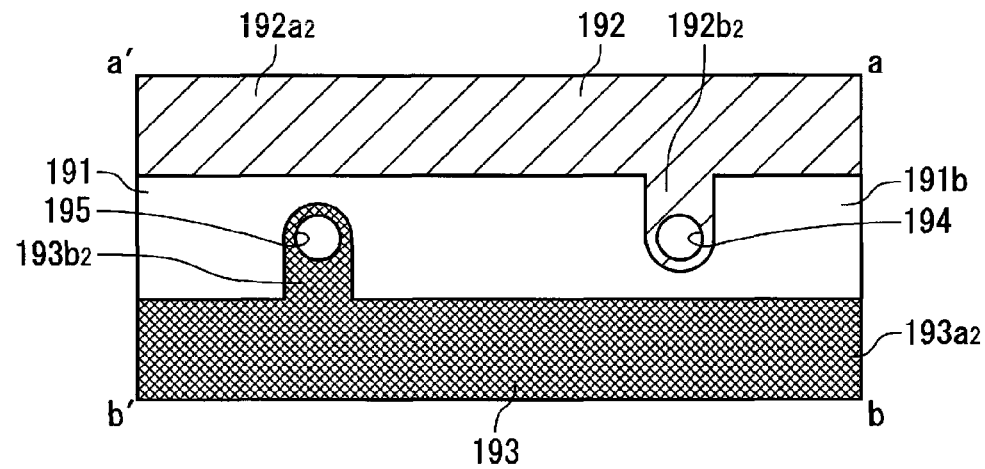

Fig. 41
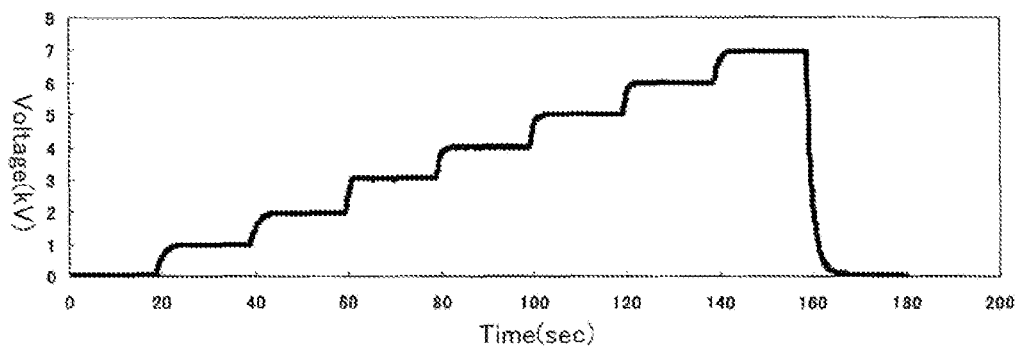
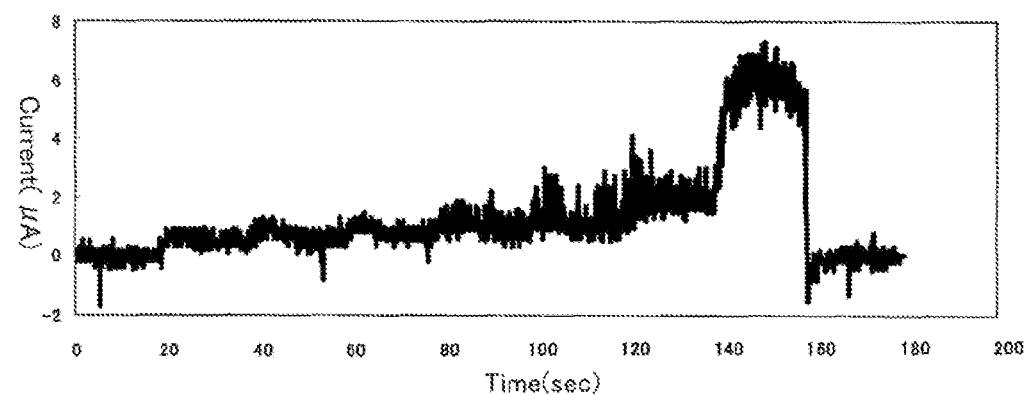
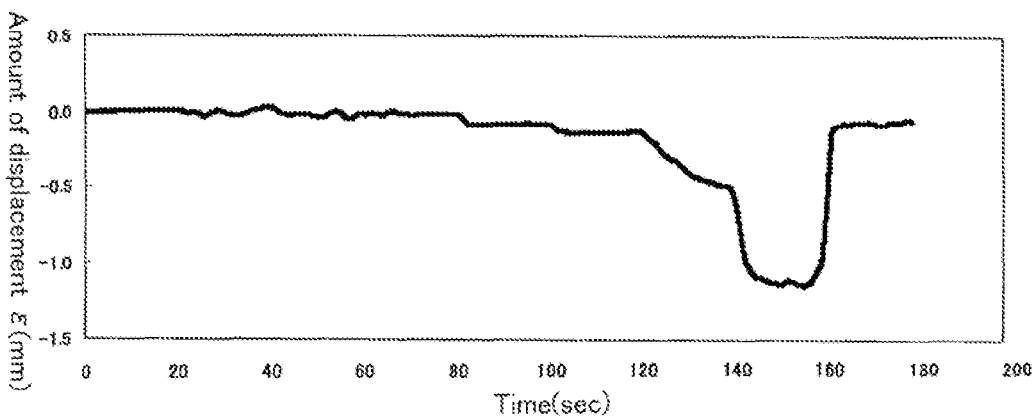

Fig. 42
(a)
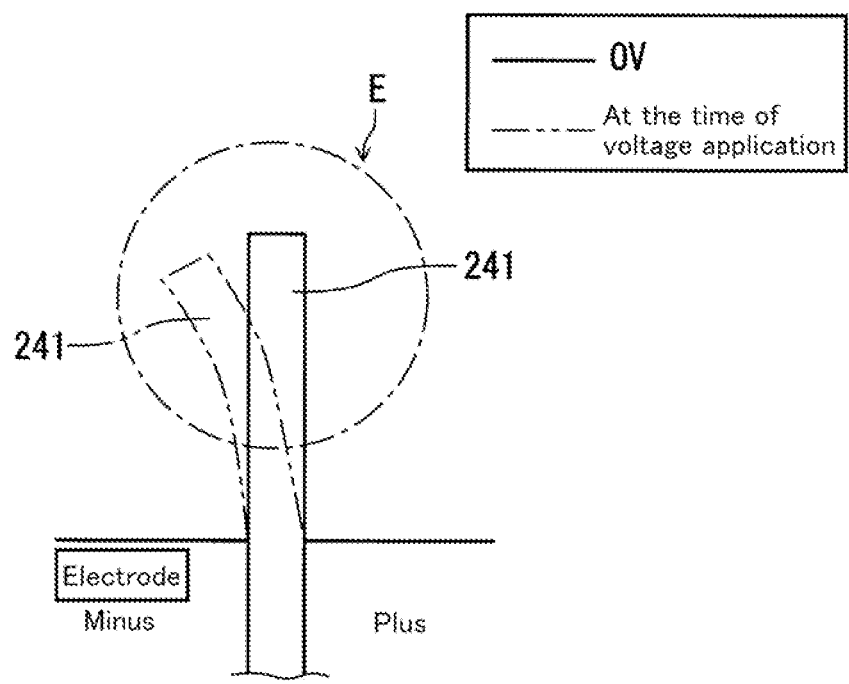
(b)
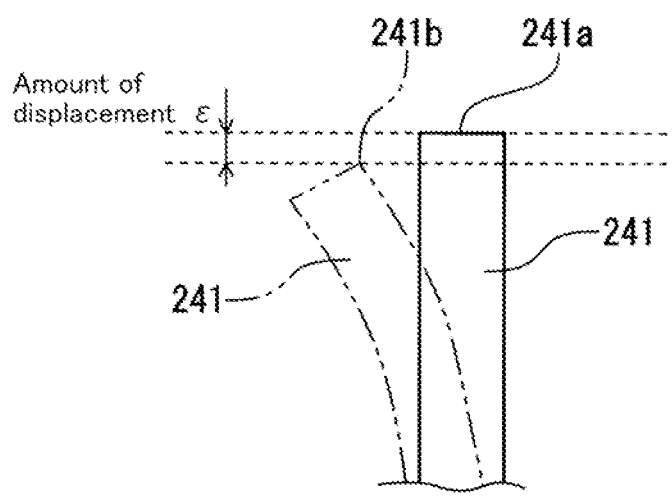

SHAFT SEALING DEVICE AND VALVE STRUCTURE USING THE SAME

BACKGROUND OF THE INVENTION

I. Technical Field

The present invention relates to a shaft sealing device for shaft-sealing a fluid using a sealing member and, particularly, to a shaft sealing device using an electro stimuli-responsive macromolecular material and to a valve structure using the same.

II. Description of the Related Art

Generally, in the case of sealing a fluid in a container at all times, a shaft sealing device using a sealing member is utilized. The shaft sealing device is intended to seal the flow of the fluid via the sealing member. As the sealing member of the shaft sealing device, an annular O-ring or packing substantially circular in cross section, for example, is used in order to seal a wide variety of fluids including air, water, oil and gas. The sealing member is required to have high sealing performance because the principal function thereof is to seal the fluids.

For this reason, the sealing member is axially attached to a groove of a substantially rectangular shape in cross section formed within the same plane in the radial direction of a shaft or hole of one of members in the shaft sealing device and, when attaining a seal by pressure of contact with the other of the members in the shaft sealing device, is compressed by the shape of the groove. It is therefore required to have a compression allowance. After the assemblage of the shaft sealing device, the O-ring, for example, is compressed via the compression allowance to produce a repulsion force and, by the repulsion force, fulfills contact surface pressure sealability to attain a shaft seal.

In addition, the O-ring is generally made from one of various kinds of synthetic rubber materials. In order to fulfill an appropriate compression stress within a range in which extraordinary deformation is not induced, the material is required to have a prescribed low compression set and further satisfy characteristics including antiweatherability, abrasion resistance, heat resistance, cold resistance, oil resistance and chemical resistance. In addition, since O-rings are used in shaft sealing devices over a wide variety of fields including fields of automobiles, constructing machines, airplanes, office automation equipment and industrial instruments, for example, the material for the O-rings is selected to have an appropriate compression allowance in accordance with an intended field (purpose) and, even when being used in either a state accompanying the movement of a shaft sealing portion or a stationary state not accompanying the movement of the shaft sealing portion, fulfills durability, insertability and pressing crack prevention, not to mention securement of a shaft-sealing function. Thus, an ordinary shaft sealing device aims first at enhancing a sealing function with a sealing member, such as an O-ring. Generally, therefore, a sealing region of the sealing member or fluid is determined at a prescribed location. An apparatus having such a sealing device embedded therein has a complicated internal structure.

Assuming now that it is necessary to switch the sealing region to an unsealing region, a section of attachment of a sealing member or housing in the sealing region has to be provided with a separate moving mechanism in order to move the sealing region. The moving mechanism includes a screw feed mechanism, a piston-cylinder mechanism and a rotating mechanism, for example. In order to operate these mechanisms, it is necessary to use some power means, such as human power, electricity, air, hydraulic pressure, spring, etc.

On the other hand, not a sealing mechanism, but a valve using a so-called artificial muscle and having no complicated power means is disclosed (refer to Japanese Patent No. 3,501, 216, for example). This valve uses an artificial muscle as a valving element and deforms the valving element per se to enable opening and closing a flow path. The valve disclosed in the Document uses as the valving element the artificial muscle formed of an electrostrictive elastic polymer film and deforms the valving element through a voltage ON-OFF operation to bring the valving element into contact with and separation from a valve seat, thereby opening and closing the flow path. The artificial muscle in this valve is called an EPAM (Electroactive Polymer Artificial Muscle) comprising a thin rubber-like macromolecular film (elastomer) and elastic electrodes sandwiching the film, in which voltage is applied between the electrodes to elongate the macromolecular film in a plane direction (to diameter-enlarge it in a circumferential direction).

SUMMARY OF THE INVENTION

However, the case where the shaft sealing device is provided with a moving mechanism or power means in order to switch the sealing region to the unsealing region has entailed a problem that the device becomes complicated in structure and large in entire size. For this reason, the device has possibly been increased in weight and manufacturing cost. In addition, since switching between the sealed state and the unsealed state has accompanied mutual contact and sliding motion among parts constituting the moving mechanism, the contact and sliding motion has possibly caused the parts constituting the moving mechanism and the sliding members to abrade away. Furthermore, since a seal material is moved in a state of contact with and pressure application to a counterpart sealing member within the sealing region, abrasion accompanying the sliding motion has been induced. When a sealing portion including an O-ring has induced abrasion over the entire circumference thereof, fluid leakage is liable to generate due to the pressure reduction at or damage on a contact portion and, in this case, abrasion has further been induced due to external factors including a coarse sliding surface and insufficient lubrication. Moreover, the fluid leakage is liable to generate even when the sliding surface of the O-ring has been abraded away and, when the sliding surface of the O-ring has had scratches, abrasion is further been induced. Particularly, in the case where the motion speed of the moving mechanism has been rapid, where the movement has been made in an eccentric state, where the plane roughness of the sliding surface has been large or where the lubrication has been insufficient, the seal material has possibly been twisted.

Furthermore, since a noise is possibly generated due to the contact or sliding motion of the seal material, sealing member or moving mechanism or since a new task of using a lubricant in order to prevent this noise or abrasion is possibly necessitated, the shaft sealing device has entailed a problem that the reliability thereof at the time of sealing is lowered or that the durability life thereof is considerably shortened.

In addition, though the shaft sealing device is configured so as to fulfill high sealing performance through the securement of precision in plane coarseness of the sealing member in the sealing region, through the attainment of sealing the fluid by the pressure of contact of the seal material with the counterpart member induced in consequence of compressing the compression allowance and through the increase in pressure of contact (self-sealing function) due to the compression of the compression allowance in addition to the deformation of the seal material accompanying the compression, thereby fulfilling contact surface pressure higher than the fluid pressure, it has generally been known that even in the case of the shaft sealing device, it is difficult to completely prevent fluid leakage because a phenomenon of entraining the fluid accompanying the movement of the sealing portion occurs. Furthermore, since an acceptable range of the amount of fluid leakage at the time of shaft sealing has been set in accordance with an intended purpose of a shaft sealing device and since the shaft sealing device is generally required to perform shaft seal while maintaining the amount of fluid leakage within the set acceptable range, the amount of fluid leakage becomes difficult to control.

On the other hand, though Patent Document 1 uses the EPAM as the valving element to eliminate any complicated power mechanism, since the valving element per se constitutes the EPAM and since the fluid pressure is received on the pressure-receiving area of the entire EPAM at the time of fluid sealing, the EPAM is required to have both large compression strength and large sealing power. In addition, since it is necessary to provide a separate sealing mechanism in a main body and prepare a valve seat portion for seating, the application of the EPAM to the valving element per se is irrationalistic because the strength resistance and stress characteristics accompanying deformation the EPAM has are not utilized as-is. Particularly, Patent Document 1 neither has any idea or suggestion in respect of the point of the present inventors' observation that an EPAM is applied to a shaft sealing structure per se nor has any idea or suggestion with respect to the fact that an increase and decrease in shaft sealing power is subtly adjusted with high precision by the function of the EPAM to utilize a fluid leakage phenomenon including minute leakage.

The present inventors have reached the development of the present invention as a consequence of keen studies made in view of the conventional state of affairs described above. The object of the present invention is to provide a shaft sealing device with a simple internal structure that switches a sealing state and an unsealing state of a fluid, with high sealing performance maintained, because of no abrasion accompanying the movement of a sealing material or a sealing member, thereby enabling feeding a fluid at a predetermined flow rate, and adjusts the expanding rate of the sealing material with the quantity of an external electric signal and accordingly adjusts the contact face pressure to enable controlling the amount of leakage of the fluid highly precisely, so that it can be used for all applications, and to provide a valve structure using the shaft sealing device.

To attain the above object, the invention relates to a shaft sealing device comprising a device body, a shaft sealing portion disposed in the device body, a shaft sealing body formed of a macromolecular material and made expansible or contractible, or deformable, through external electro stimuli applied to the shaft sealing body and flow passages disposed in the shaft sealing portion for feeding a fluid leaked due to expansion or contraction, or deformation, of the shaft sealing body.

The invention also relates to the above shaft sealing device, wherein the shaft sealing body is formed of an electro stimuli-responsive macromolecular material that is subjected to enlarged deformation in a direction orthogonal to a voltage application direction when having been charged with external electro stimuli, thereby heightening shaft sealing power whereas the electro stimuli-responsive macromolecular material is returned to an original position while being subjected to contracted deformation in the direction orthogonal to the voltage application direction when having been discharged, thereby inducing an appropriate leakage phenomenon due to a decrease in shaft sealing power, or that is returned to the original position while being subjected to the enlarged deformation in the direction orthogonal to the voltage application direction when having been discharged, thereby heightening the shaft sealing power whereas the electro stimuli-responsive macromolecular material is lowered in shaft sealing power while being subjected to contracted deformation in the direction orthogonal to the voltage application direction when having been charged with the external electro stimuli, thereby inducing the appropriate leakage phenomenon.

The invention also relates to the first mentioned shaft sealing device, wherein the shaft sealing body is formed of an electroconductive macromolecular material that is returned to original position while being expanded when application of external electro stimuli has been stopped, thereby heightening shaft sealing power, whereas the electroconductive macromolecular material is lowered in shaft sealing power while being shrunk when the external electro stimuli have been applied, or that is heightened in shaft sealing power while being expanded when the external electro stimuli have been applied, whereas the electroconductive macromolecular material is returned to the original position while being shrunk when the application of the external electro stimuli have been stopped, thereby inducing an appropriate leakage phenomenon due to a decrease in shaft sealing power.

The invention relates to the first mentioned shaft sealing device, wherein the shaft sealing body is formed of an ionically conductive macromolecular material that is returned to an original position while being deformed when application of external electro stimuli has been stopped, thereby heightening shaft sealing power, whereas the ionically conductive macromolecular material is deformed when the external electro stimuli have been applied, thereby inducing an appropriate leakage phenomenon due to a decrease in shaft sealing power, or that is heightened in shaft sealing power while being deformed when the external electro stimuli have been applied, whereas the ionically conductive macromolecular material is returned to the original position while being deformed when the application of the external electro stimuli has been stopped, thereby inducing the appropriate leakage phenomenon due to a decrease in shaft sealing power.

The invention relates to the first mentioned shaft sealing device, wherein the shaft sealing body is formed of an electro stimuli-responsive macromolecular material that is returned to an original position while being deformed when application of external electro stimuli has been stopped, thereby heightening shaft sealing power, whereas the electro stimuli-responsive macromolecular material has deformed a section thereof other than a section thereof to which the external electro stimuli have been applied, thereby inducing an appropriate leakage phenomenon due to a decrease in shaft sealing power.

The invention relates to the first mentioned shaft sealing device, wherein the shaft sealing body is formed of an electro stimuli-responsive macromolecular material that deforms, when external electro stimuli have been applied, a section thereof other than a section thereof to which the external electro stimuli have been applied, thereby heightening shaft sealing power, whereas the electro stimuli-responsive macromolecular material is returned to an original position while being deformed when application of the external electro stimuli has been stopped, thereby inducing an appropriate leakage phenomenon due to a decrease in shaft sealing power.

The invention relates to any one of the first to fourth mentioned shaft sealing devices, further comprising a holder capable of retaining the shaft sealing body on a retaining surface thereof from upper and lower directions and electrodes which are provided on the retaining surface of the holder and which are electrically connected to an exterior of the device body.

The invention relates to any one of the first, fifth and sixth mentioned shaft sealing devices, wherein the shaft sealing body is provided with electrodes which are connected to an exterior of the device body in a state clamping part of upper and lower surfaces of the shaft sealing body.

The invention relates to any one of the first to sixth mentioned shaft sealing devices, wherein the shaft sealing body comprises at least two shaft sealing bodies disposed in the device body and the flow passages comprise at least three leaked-fluid flow passages disposed in the device body, and further comprising a holder capable of retaining the shaft sealing bodies, respectively, on a retaining surface thereof from upper and lower directions and electrodes which are provided on the retaining surface of the holder and which are electrically connected to an exterior of the device body, wherein application and stop of application of external electro stimuli to the shaft sealing bodies from the electrodes makes the shaft sealing bodies expansible or contractible, or deformable, to make the flow passages switchable.

The invention relates to any one of the second to ninth mentioned shaft sealing devices, wherein the leakage phenomenon includes a minute leakage phenomenon.

The invention relates to a shaft sealing device comprising a device body, a holder, and an annular shaft sealing body which is inserted into the device body via the holder, which has a base fixed to the holder or device body and a distal free end serving as a shaft sealing portion and which allows the shaft sealing portion to expand or contract in a substantially perfectly circular shape when external electro stimuli have been applied thereto, thereby obtaining a shaft sealed state or a fluid leaking state.

The invention relates to the above shaft sealing device, wherein the shaft sealing body comprises a plate-like annular base material which is formed of a macromolecular material made expansible or contractible, or deformable, through external electro stimuli applied to the shaft sealing body and which has front and back surfaces provided respectively with electrodes.

The invention relates to the eleventh mentioned shaft sealing device, wherein the shaft sealing body comprises a hollow cylinder which is formed of a macromolecular material made expansible or contractible, or deformable, through external electro stimuli applied to the shaft sealing body and which has inner and outer circumferential surfaces provided integrally with electrodes, respectively.

The invention relates to a valve structure using any one of the eleventh to thirteenth mentioned shaft sealing device, wherein the device body is formed with plural flow passages communicating with an exterior of the device body, and the shaft sealing portion that is the free end of the shaft sealing body is disposed between adjacent flow passages so as to be brought to a shaft sealed state or a fluid leaking state, thereby making the flow passages switchable.

The invention relates to the above valve structure, wherein the shaft sealing body has a base near a substantially central part thereof and opposite free ends serving as shaft sealing portions that permit contact with or separation from at least two inner cylindrical annular portions, thereby making the flow passages switchable.

The invention relates to the fourteenth mentioned valve structure, wherein the shaft sealing body comprises at least two shaft bodies which are disposed in the device body and each of which has a free end serving as a shaft sealing portion brought to a shaft sealed state or a fluid leaking state.

EFFECTS OF THE INVENTION

According to the invention, it is possible to provide a shaft sealing device with a simple internal structure that switches a sealing state and an unsealing state of a fluid, with high sealing performance maintained, because of no abrasion accompanying the movement of a shaft sealing body, thereby enabling feeding a fluid at a predetermined flow rate, and adjusts the amount of expansion or contraction, or the amount of deformation, of the shaft sealing body with the quantity of an external electric signal and accordingly adjusts the contact face pressure to enable controlling the amount of leakage of the fluid highly precisely, so that it can be used for all applications. In addition, since the shaft sealing body can be deformed in the absence of a moving mechanism to enable preventing the inside of the shaft sealing device from being deteriorated, the shaft sealing device can fulfill an excellent shaft sealing function over a long period of time. As a result, the shaft sealing device of the present invention can be utilized as a substitute for an electromagnetic valve and, further since the amount of minute leakage in a shaft sealed state can be controlled, utilized in various technical fields.

According to the invention, since only the shaft sealing body can be increased or decreased in diameter through performing or stopping the application of the external electro stimuli, it is possible to switch between the sealed state and the unsealed state while preventing deterioration of the device body through keeping the movable portion of the device body to the minimum. In the sealed state, the shaft sealing device can heighten the shaft sealing power to fulfill the excellent sealability and, in the unsealed state, can flow a fluid at a constant flow rate, with the amount of leakage peculiar to the device body as the flow rate. In this case, furthermore, the shaft sealing device allows the shaft sealing body to have an EPAM structure that can enlarge the pressure or distortion amount during the operation to enable a higher shaft sealing function to be fulfilled, allows the device body to have a light weight because of the simple structure and allows the sound generated to be quiet.

According to the invention, it is possible to provide the shaft sealing device, in which various macromolecular materials are used to enable the configuration of the shaft sealing body and the provision of the shaft sealing structure made appropriate in accordance with the macromolecular materials different in expansion or contraction, or deformation, of the shaft sealing portion. Also in this case, excellent functionality in the time of sealing or unsealing can be fulfilled similarly in the case of the provision of the EPAM structure. Of these inventions, according to the inventions of claims 5 and 6 in particular, it is possible to provide the shaft sealing device, in which since the section other than the section to which the external electro stimuli have been applied is deformed, it is unnecessary provide the section with electrodes and, since the deformed portion is the free end, it is possible to make the deformation amount large. For these reasons, it is possible to provide the shaft sealing device capable of acquiring a large amount of leakage flow rate and controlling the flow rate with high precision.

According to the invention, since it becomes possible to control the voltage applied from the exterior of the device body to the shaft sealing body, it is possible to provide the shaft sealing device capable of applying the device body to a small-sized device or instrument and downsizing a space occupied by the shaft sealing device and thus being utilized at various places.

According to the invention, it is possible to provide the shaft sealing device that can be used as a flow passage switching valve and applied to various switching mechanisms including a piston-cylinder mechanism, for example and, also in this case, control the piston-cylinder operation speed with high precision.

According to the invention, since minute leakage in the shaft sealed state can be controlled, it is possible to provide the shaft sealing device capable of making a control of a minuter leakage amount in addition to a control of a leakage amount of an ordinary fluid flowing.

According to the invention, the shaft sealing device has a shaft sealing structure capable of expanding or contracting the free end of the shaft sealing body in a perfectly circular shape relative to the inner circumferential surface of the device body while maintaining high precision and controlling the shaft sealing body in the shaft sealed state or fluid leakage state on the primary and secondary sides through the circumferential surface of the shaft sealing body coming into contact with or separating from the cylindrical flow passage and can therefore be applied to various kinds of flow passages.

According to the invention, since only the shaft sealing body can be expanded or contracted through performing or stopping the application of the external electro stimuli, it is possible to switch between the sealed state and the unsealed state while preventing deterioration of the device body through keeping the movable portion of the device body to the minimum. In the sealed state, the shaft sealing device can heighten the shaft sealing power to fulfill the excellent sealability and, in the unsealed state, can flow a fluid at a constant flow rate, with the amount of leakage peculiar to the device body as the flow rate.

According to the invention, it is possible to provide the shaft sealing device having the effects, in addition of the effects of claim 12, of reducing the distortion of the shaft sealing body after the integral formation of the shaft sealing body in the shape of a ring and making the control of the shaft sealed state or fluid leaking state with higher precision.

According to the invention, it is possible to provide the valve structure using the valve sealing device capable of making the structure of the shaft sealing simple and compact and being utilized as a switching valve of a structure which can switch plural flow passages and which has not existed conventionally. In addition, since the number of the flow passages can be increased in accordance with embodiments and, even in the case of adopting the multiway valve structure, each flow passage can be brought to the prescribed shaft sealed state or fluid leakage state while controlling the shaft sealed state or fluid leakage state with high precision, the valve structure having the shaft sealing device can be controlled as the multiway valve and utilized in various fields.

BRIEF DESCRIPTION OF THE DRAWINGS

FIG. 14 is an explanatory view showing the characteristics of an electro stimuli-responsive macromolecular material, electroconductive macromolecular material and ionically conductive macromolecular material used in the present invention.
FIG. 15 is an explanatory view showing the characteristics of the electro stimuli-responsive macromolecular material which is used in the present invention and which, when having been subjected to external electro stimuli, has a section thereof, other than a section thereof to which the external electro stimuli have been applied, deformed.
FIG. 16 includes schematic views showing the movement made when an electric field has been applied to the electro stimuli-responsive macromolecular material which, when having been subjected to external electro stimuli, has a section thereof, other than a section thereof to which the external electro stimuli have been applied, deformed, (a) being a schematic view showing the distribution of the electric field applied to the electro stimuli-responsive macromolecular material, (b) being a schematic view showing a state of a stress generated on the electro stimuli-responsive macromolecular material and (c) being a schematic view showing a state in which the electro stimuli-responsive macromolecular material has been deformed.
FIG. 17 includes cross sections showing a shaft sealing device in which a shaft sealing body made of an electro stimuli-responsive macromolecular material has been retained by a holder.
FIG. 18 includes cross sections showing a shaft sealing device in which a shaft sealing body made of an electroconductive macromolecular material has been retained by a holder.
FIG. 19 includes cross sections showing a shaft sealing device in which a shaft sealing body made of an ionically conductive macromolecular material has been retained by a holder.
FIG. 20 includes cross sections showing a shaft sealing device in which a shaft sealing body made of a macromolecular material has been retained by a holder.
FIG. 21 includes cross sections showing a state in which a separator has been attached to the shaft sealing device of FIG. 17.

FIG. 22 includes cross sections showing a state in which a separator has been attached to the shaft sealing device of FIG. 18.

FIG. 23 is an explanatory view showing the characteristics of a macromolecular material used for a valve structure.

FIG. 24 includes cross sections showing a shaft sealing device in which a shaft sealing body made of an electro stimuli-responsive macromolecular material has been formed annularly.

FIG. 25 includes cross sections showing a shaft sealing device in which a shaft sealing body made of an electroconductive macromolecular material has been formed annularly.

FIG. 26 includes cross sections showing another example of the shaft sealing device in which a shaft sealing body made of an electroconductive macromolecular material has been formed annularly.

FIG. 27 includes cross sections showing a shaft sealing device in which a shaft sealing body made of an ionically conductive macromolecular material has been formed annularly.

FIG. 30 includes explanatory views showing a state of development of the shaft sealing body of FIG. 28, (a) being a schematic perspective view of the shaft sealing body, (b) being a development view showing the front side of (a) and (c) being a development view showing the back side of (a).

FIG. 33 includes explanatory views showing a state of development of the shaft sealing body of FIG. 31, (a) being a schematic perspective view of the shaft sealing body, (b) being a development view showing the front side of (a) and (c) being a development view showing the back side of (a).

FIG. 41 includes graphs showing measurement results of measuring conditions and amounts of displacement by the displacement measuring device, (a) being a graph showing voltage application conditions, (b) being a graph showing a state of electric current at the time of voltage application and (c) being a graph showing the amount of displacement of a measured body.

FIG. 42 includes schematic views showing a bend displacement portion of a measured body, (a) being a schematic view showing the displacement portion of the measured body and (b) being an enlarged view of a portion E in (a).

DETAILED DESCRIPTION OF THE INVENTION

Figure 1:
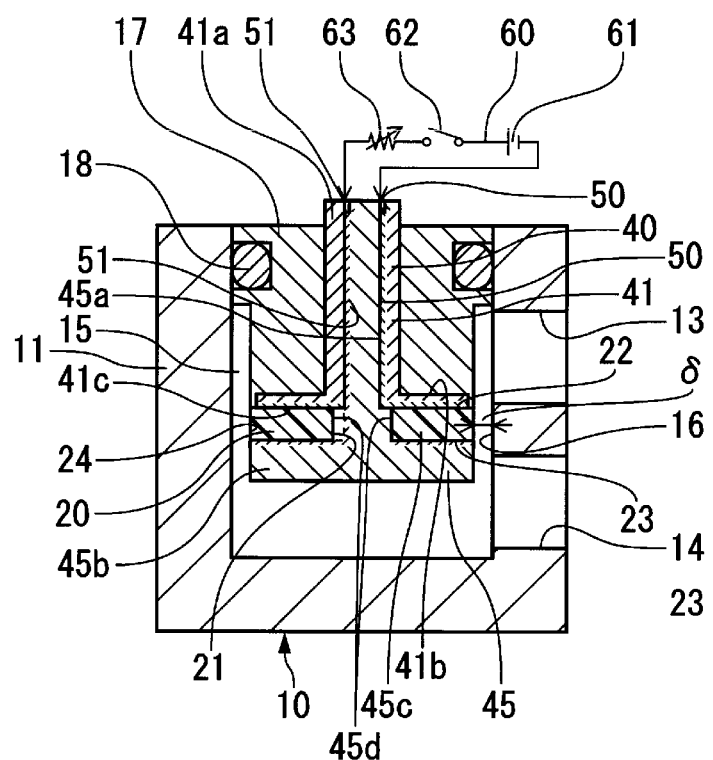
FIG. 1 is a cross section showing one example of a shaft sealing device according to the present invention.

The shaft sealing device of the present invention will be described hereinafter in detail with reference to the drawings. The shaft sealing device comprises a device body, a shaft sealing portion disposed in the device body, a shaft sealing body disposed in the shaft sealing portion, made of a macromolecular material and made expansible or contractible, or deformable, through outer electro stimuli, and flow passages which are formed in the shaft sealing portion and on which a fluid leaked due to the expansion or contraction, or the deformation, of the shaft sealing body. The expansion or contraction used herein in the present invention is defined by a change in shape of the shaft sealing body accompanying a change in volume of the shaft sealing body, and the deformation is defined by a change in shape of the shaft sealing body accompanying no change in volume of the shaft sealing body.

The macromolecular material used in the present invention includes at least four kinds of materials, one being an electro stimuli-responsive macromolecular material (dielectric elastomer), another an electroconductive macromolecular material, another an ionically conductive macromolecular material and the remainder an electro stimuli-responsive macromolecular material having deformed a section other than a section to which external electro stimuli have been applied. Here, the characteristics of each macromolecular material are shown in FIGS. 14 and 15.

When external electro stimuli have been applied to the shaft sealing body using the electro stimuli-responsive macromolecular material, the shaft sealing body is expansion-deformed in the direction orthogonal to the direction of the application to heighten shaft sealing power, whereas the shaft sealing body is returned to the original position while being contraction-deformed in the direction orthogonal to the application direction when the application of the external electro stimuli has been stopped, thereby lowering the shaft sealing power to induce an appropriate fluid leakage phenomenon. Thus, the shaft sealing device using the external electro stimuli forms flow passages when applying no current, i.e. makes a so-called normally open (NO) device operation, and has the material body deformed as a mode of change made when flowing a leaked fluid. In this case, a potential difference is given (voltage is applied) to between compliant electrodes provided respectively on the front and back surfaces of the elastomer material to reduce the material in the width direction by means of the Coulomb effect, thereby making a motion of expanding the material in the surface direction.

The shaft sealing body using the electroconductive macromolecular material is returned to the original position while being expanded when the application of the exterior electro stimuli has been stopped, thereby heightening the shaft sealing power, whereas it is contracted to lower the shaft sealing power when the external electro stimuli have been applied thereto, thereby inducing an appropriate fluid leakage phenomenon. Thus, the shaft sealing device using the electroconductive macromolecular material is brought to a shaft sealed state, i.e. a so-called normally closed (NC) device state, when applying no current, and has the material body expanded or contracted as a mode of change made when a leaked fluid flows. In this case, a potential difference is given to the electroconductive macromolecular material, the material body is expanded or contracted through adsorption or desorption of moisture in the air.

The shaft sealing body using the ionically conductive macromolecular material is returned to the original position while being deformed when the application of the exterior electro stimuli has been stopped, thereby heightening the shaft sealing power, whereas it is deformed to lower the shaft sealing power when the external electro stimuli have been applied thereto, thereby inducing an appropriate fluid leakage phenomenon. Thus, the shaft sealing device using the ionically conductive macromolecular material is brought to the NC device state and has the material body expanded or contracted as a mode of change made when a leaked fluid flows. In this case, a potential difference is given to the ionically conductive macromolecular material, cations in the material body accompany moisture and move to the side of anions and, as a result, the material body has a lopsided water content to bend the material body.

The shaft sealing body using the electro stimuli-responsive macromolecular material having deformed a section other than a section to which external electro stimuli have been applied, is returned to the original position while being deformed when the application of the external electro stimuli has been stopped, thereby heightening the shaft sealing power, whereas the section other than the section to which external electro stimuli have been applied is deformed to lower the shaft sealing power, thereby inducing an appropriate fluid leakage phenomenon. Thus, the shaft sealing device using this electro stimuli-responsive macromolecular material is brought to the NC device state and the material body is deformed as a mode of change made when a leaked fluid flows.

As one example of the electro stimuli-responsive macromolecular material, for example, polyether urethane can be cited. This material comprises a mixture of a base compound and a curing agent. The base compound includes at least styrene, a nitrile compound, BHT (butylhydroxytoluene) and ester phthalate. On the other hand, the curing agent includes at least phthalic acid, diphenylmethane di-isothianate and ester phthalate. As a concrete example of the electro stimuli-responsive macromolecular material containing these components, a gel sheet manufactured by EXSEAL Corporation and sold under the trade name Hitohada (registered trademark) can be raised, for example. In addition, the electro stimuli-responsive macromolecular material may be formed of thin silicon film, for example, besides the polyether urethane and, in this case, the same functions and characteristics as described above can be fulfilled. Furthermore, other material than those mentioned above may be used insofar as the material can fulfill the same functions and characteristics as described above.

The electro stimuli-responsive macromolecular material is deformed as shown in FIG. 16. This figure shows a state in which an electric field is given (voltage is applied) to a shaft sealing body 250 formed of an electro stimuli-responsive macromolecular material that is polyurethane elastomer via fixed electrodes 251 and 252 each opposite locally to the shaft sealing body 250. In the figure, when an electric field is applied to the fixed electrodes 251 and 252, with the shaft sealing body 250 sandwiched between the fixed electrodes 251 and 252, (1) dielectric polyols or polyols having dipole moment are oriented by the electric field to change the structure of a macromolecular chain at the opposite portions of the fixed electrodes 251 and 252 as shown in FIG. 16(*a*). At this time, as shown in FIG. 16(*b*), (2) the dielectric elastomer is reduced in the width direction by means of the Coulomb effect of the electric field by the opposite fixed electrodes 251 and 252, thereby expanding the shaft sealing body 250 in the plane direction. In addition, (3) injection and uneven distribution of electric charge induce an asymmetric volume change at the electrodes.

Furthermore, in the peripheries of the circumferences of the fixed electrodes 251 and 252, the electric field is equally attenuation-distributed in the radial direction (plane direction), with a value at the peripheries of the fixed electrodes 251 and 252 as the maximum value, thereby operating a synthetic deforming stress by the three functions (1) to (3) to form stress distribution reducing the electric field homogenously in the plane direction, with the value at the peripheries of the fixed electrodes 251 and 252 as the maximum value. As a result, bend formation is induced.

Incidentally, any of the macromolecular materials may be molded in a material shape so as to have characteristics such that the movements made when performing or stopping the application of external electro stimuli are reversed. In addition, even in the case of using any macromolecular material, a fluid leak phenomenon includes so-called minute leakage that indicates a state in which leakage has induced in a shaft sealed state and, when applying external electro stimuli, the value of an electric signal is changed to control the amount of expansion or contraction, or the amount of deformation, thereby enabling an optional control of the degree of contact pressure of the shaft sealing body.

Each of the shaft sealing bodies using the electro stimuli-responsive macromolecular material, electroconductive macromolecular material and ionically conductive macromolecular material, of the macromolecular materials described above, is retained by a holder capable of retaining it in the upper and lower directions and, by providing the retaining surfaces of the holder for the shaft sealing body with electrodes electrically connected to an exterior of the device body, it becomes possible to apply or stop the application of the external electro stimuli from the electrodes to the shaft sealing body.

FIGS. 17 to 19 are schematic views of the shaft sealing devices in which the shaft sealing bodies formed respectively of the electro stimuli-responsive macromolecular material, electroconductive macromolecular material and ionically conductive macromolecular material are retained by these holders. The shaft sealing device in FIG. 17 has a shaft sealing body 20A formed of the electro stimuli-responsive macromolecular material and formed in the shape of a disc accompanying a concentric through-hole 21A and having an appropriate thickness. The shaft sealing body 20A is provided on the upper and lower surfaces thereof with electrodes 22A and 23A, respectively. The shaft sealing body 20A is retained from the upper and lower sides by holders 40A and 45A that are provided on the surfaces thereof for retaining the shaft sealing body 20A with electrodes 50A and 51A, respectively, and is configured to enable applying voltage from the electrodes 50A and 51A thereto via the electrodes 22A and 23A.

When a power source for the shaft sealing device, not shown, has been turned on to give a potential difference to between the electrodes of the holders 40A and 45A, the shaft sealing body 20A retained between the holders 40A and 45A is deformed to expand in the diametrical direction as shown in FIGS. 14 and 17(*a*), whereas when the electrodes have been deprived of the potential difference (the power source has been turned off), the shaft sealing body is deformed to contract its diameter in the diametrical direction as shown in FIG. 17(*b*).

The shaft sealing device in FIG. 18 has a shaft sealing body 20B formed of the electroconductive macromolecular material and formed in the shape of a disc accompanying a concentric through-hole 21B and having an appropriate thickness. In addition, in the case where the shaft sealing body is formed of the electroconductive macromolecular material, since the material has a property of passing a current through itself, it is unnecessary to provide the upper and lower surfaces of the shaft sealing body with electrodes. The shaft sealing body 20B is retained from the upper and lower sides by holders 40B and 45B that are provided on the surfaces thereof for retaining the shaft sealing body 20B with electrodes 50B and 51B, respectively, and voltage is applied from the electrodes 50B and 51B to the shaft sealing body 20B.

When a potential difference is given to between the electrodes of the holders 40B and 45B, the shaft sealing body 20B retained between the holders 40B and 45B is contracted in the diametrical direction as shown in FIGS. 14 and 18(a), whereas when the electrodes have been deprived of the potential difference, the shaft sealing body 20B is returned to the original position while being expanded in the diametrical direction.

The shaft sealing device in FIG. 19 has a shaft sealing body 20C formed of the ionically conductive macromolecular material and formed in the shape of a disc accompanying a concentric through-hole 21C and having an appropriate thickness. The upper and lower surfaces of the shaft sealing body 20C are provided with electrodes 22C and 23C, respectively. The shaft sealing body 20C is retained from the upper and lower sides by holders 40C and 45C that are provided on the surfaces thereof for retaining the shaft sealing body 20C with electrodes 50C and 51C, respectively, and voltage is applied from the electrodes 50C and 51C to the shaft sealing body 20C.

When a potential difference is given to between the electrodes of the holders 40C and 45C, the shaft sealing body 20C retained between the holders 40C and 45C is expanded on the lower surface side and contracted on the upper surface side as shown in FIGS. 14 and 19(a) and, as a result, entirely deformed to bend, thereby being reduced in shape in the contracting direction. When the electrodes have been deprived of the potential difference, the shaft sealing body 20C is returned to the original position while being deformed in the diametrical direction.

In the meantime, FIG. 20 is a schematic view of the shaft sealing device, in which retained is a shaft sealing body 20D using an electro stimuli-responsive macromolecular material deforming a section other than a section to which external electro stimuli have been applied. In the shaft sealing device, the shaft sealing body 20D is formed in the shape of a disc accompanying a concentric through-hole 21D and having an appropriate thickness. The shaft sealing body 20D is provided with electrodes 22D and 23D sandwiching part of the upper and lower surfaces of the shaft sealing body 20D. The electrodes 22D and 23D are electrically connected to an exterior of the device body, and it is possible to perform or stop the application of the external electro stimuli to part of the shaft sealing body 20D. In addition, the shaft sealing body 20D is retained by holders 40D and 45D from the upper and lower directions via the electrodes 22D and 23D.

When a potential difference has been given to between the electrode 22D on the side of the holder 40D and the electrode 23D on the side of the holder 45D, with the electrode 22D as a positive electrode and the electrode 23D as a negative electrode, the shaft sealing body 20D on the side of the electrode 22D is bend-deformed toward the side of the electrode 23D to deform part of the shaft sealing body 20D having emerged as curved, thereby allowing the neighborhood of the outer periphery of the shaft sealing body 20D to assume a shape contracted in the diametrical direction. In addition, elimination of the potential difference causes the shaft sealing body 20D to be returned to the original position while being deformed in the diametrical direction.

Incidentally, even when using any of the macromolecular materials, by varying the shape of the shaft sealing body material to be molded, it is possible to change the movements (NO and NC movements) made when performing and stopping the application of the external electro stimuli to a movement reverse to the movement shown in the above figure. Also in this case, the same functions and effects as described above can be obtained. This is applicable to examples to be described later.

Furthermore, in addition to the expansion or contraction, or the deformation, of the shaft sealing body having the holders retained thereon, it is possible to expand or contract, or deform, the shaft sealing body having holders and a separator attached thereto. A shaft sealing device provided with a shaft sealing body having a separator attached thereto will be described.

FIGS. 21 and 22 are schematic views in which a shaft sealing body has holders and a separator attached thereto. The shaft sealing device in FIG. 21 has a shaft sealing body formed of an electro stimuli-responsive macromolecular material. The shaft sealing body 30A is formed in the shape of a disc accompanying a concentric through-hole 31A and having an appropriate thickness. The shaft sealing body 30A is provided on the upper and lower surfaces thereof with electrodes 32A and 33A, respectively. The shaft sealing body 30A and a separator 35A are retained by holders 40A and 45A from the upper and lower sides thereof, and the retaining surfaces of the holders are provided with electrodes 50A and 51A, respectively. The separator 35A is formed of a flexible electroconductive material and brings the electrodes 32A and 50A to a conduction state. The separator 35A has a compliant concentric through-hole 36A and fixed to the upper surface of the shaft sealing body 30A by means of adhesive etc.

In the shaft sealing device, a potential difference has been given to between the electrodes of the holders 40A and 45A, the shaft sealing body 30A retained between the holders 40A and 45A is urged to expand in the diametrical direction as shown in FIGS. 14 and 21(a) but, at this time, the compliant separator 35A provided on the upper side prevents the shaft sealing body 30A from being expanded on the upper side and, as a result, the shaft sealing body 30A is deformed as being curved upward as the separator 35A as the basis. In addition, the elimination of the potential difference allows the shaft sealing body to be deformed as returned to the original position as shown in FIG. 21(b).

The shaft sealing device in FIG. 22 has a shaft sealing body formed of an electroconductive macromolecular material and, similarly to the case of the shaft sealing body formed of the electro stimuli-responsive material, the shaft sealing body 30B is formed in the shape of a disc accompanying a concentric through-hole 31B and having an appropriate thickness. A separator 35B is fixed to the upper surface of the shaft sealing body 30B by means of adhesion etc. Holders 40B and 45B retains the shaft sealing body 30B and separator 35B in the upper and lower directions and has the retaining surfaces thereof provided with electrodes 50B and 51B.

In the shaft sealing device, a potential difference has been given to between the electrodes of the holders 40B and 45B, the shaft sealing body 30B retained between the holders 40B and 45B is urged to contract in the backward direction as shown in FIGS. 14 and 22(a) but, at this time, the compliant separator 35A provided on the upper side prevents the shaft sealing body 30B from being contracted on the upper side and, as a result, the shaft sealing body 30B is deformed as being curved downward as the separator 35B as the basis. In addition, the elimination of the potential difference allows the shaft sealing body to be returned to the original position while being expanded.

Incidentally, since the ionically conductive macromolecular material to which a potential difference is given in a state having holders 40C and 45C only attached thereto is deformed as being curved, though attachment of a separator is not required, a separator may be attached as occasion demands. In this case, the shaft sealing body is reinforced with the separator and can function similarly to that provided with no separator.

Furthermore, since it is sufficient that the electro stimuli-responsive macromolecular material, which has deformed a section thereof other than a section to which external electro stimuli have been applied, is brought to a state having part of the upper and lower surfaces thereof sandwiched between the electrodes, though attachment of a separator is not required similarly to the case of the ionically conductive macromolecular material, a separator may be attached as occasion demands. As described in the foregoing, the shaft sealing device of the present invention may be configured to have different internal structures using various kinds of macromolecular materials and, thus, an appropriate configuration can be adopted in accordance with the state of implementation.

Figure 2:
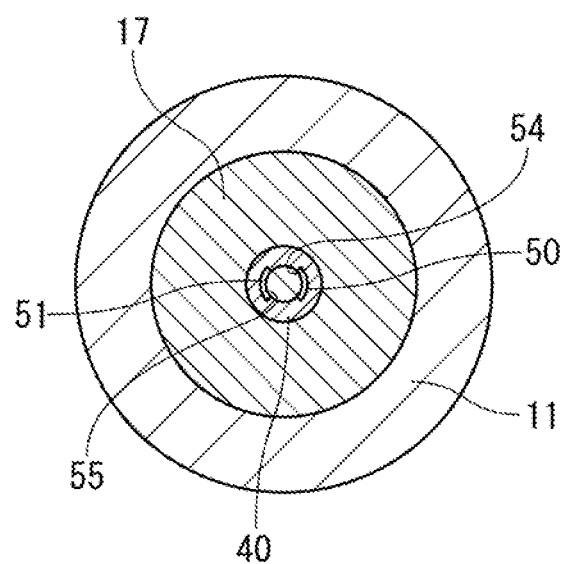
FIG. 2 is a plan view of FIG. 1.
Figure 3:
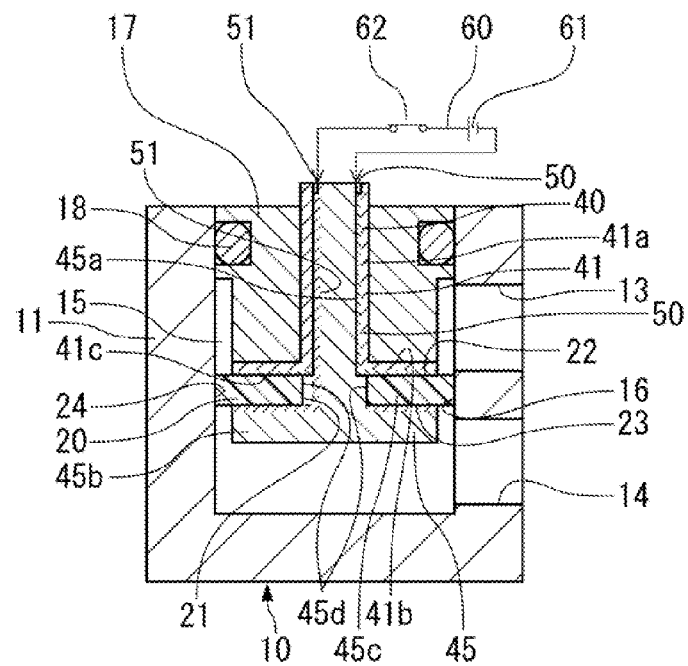
FIG. 3 is a cross section showing a shaft sealed state of the shaft sealing device of FIG. 1.

Next, the switching action of the shaft sealing device according to the present invention will be described in more detail using a typical example selected from the above examples. FIGS. 1 to 3 show one example of the shaft sealing device according to the present invention. The shaft sealing device in this example has a shaft sealing body formed of an electro stimuli-responsive macromolecular material and has a structure in which the shaft sealing body is retained by a holder only. A device body 10 comprises a housing 11, a shaft portion 15 disposed in the housing, a shaft sealing body 20 disposed in the shaft sealing portion, and leakage flow passages 13 and 14 formed in the shaft sealing portion 15 for enabling fluid leakage by deformation of the shaft sealing body 20.

The housing 11 is formed in a substantially tubular shape, and the flow passages within the housing 11 are shaft-sealed with the shaft sealing portion 15. The shaft sealing portion 15 is provided with a seating face 16, and the leakage flow passages 13 and 14 are disposed on the opposite sides of the seating face 16 and extend in parallel to each other in the circumferential direction. After the shaft sealing body 20 is disposed within the shaft sealing portion 15, an abutting surface 24 of the shaft sealing body 20 is abutted on the seating face 16 when the shaft sealing body 20 has been deformed, thereby enabling the formation of a shaft seal. In addition, when the leakage passages 13 and 14 have communicated with each other, a fluid can be leaked. Incidentally, though not shown, a flow passage can be configured through connection of an appropriate a pipe line, such as a joint or a pipe, to the leakage flow passages 13 and 14.

The shaft sealing body 20 accompanies flexible upper and lower electrodes 22 and 23 and is configured to enable the value of an electric signal to be changed when voltage is applied to the electrodes 22 and 23. In addition, the shaft sealing body 20 is configured to enable the amount of deformation to be controlled by the change of the electric signal value and the degree of pressure contact with the seating face 16 to be optionally changed. The shaft sealing body 20 assumes a substantially circular outer shape and is provided at the center section with a through-hole 21. It goes without saying that the outer shape of the shaft sealing body 20 includes various shapes, such as quadrangles including a rectangle and a trapezoid, and polygons, besides the annular shape shown in the drawing. The shaft sealing body 20 is provided on the outer periphery thereof with the abutting surface 24 that can abut on the seating face 16 of the housing 11 and, at this time, it is possible to establish a shaft sealed state, a minute fluid leakage state in which contact surface pressure is adjustable and a fluid leakage state when the abutting surface and the seating face have separated from each other to release the shaft sealed state.

Figure 4:
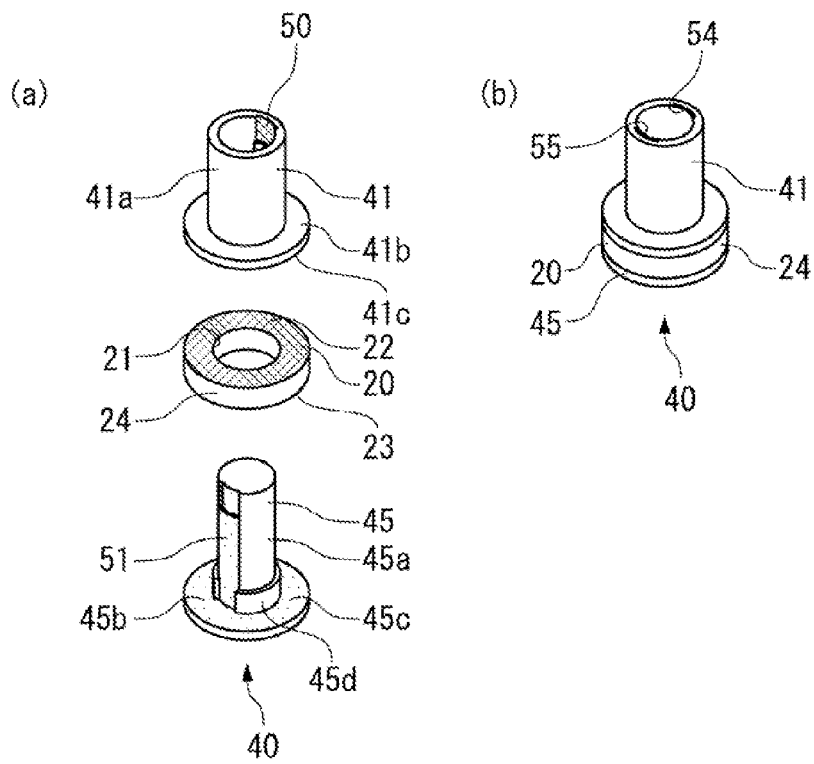
FIG. 4 includes top perspective views showing one example of a sealing member, (a) being an exploded perspective view of the sealing member and (b) being a perspective view showing an assembled state of the sealing member.
Figure 5:
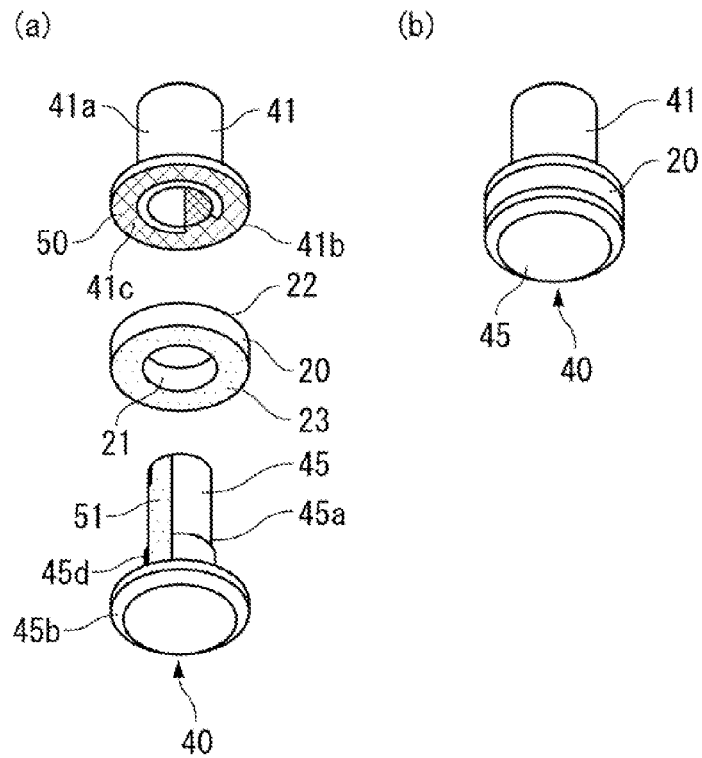
FIG. 5 includes bottom perspective views showing the example of the sealing member, (a) being an exploded perspective view of the sealing member and (b) being a perspective view showing an assembled state of the sealing member.

In FIGS. 4 and 5, a holder 40 comprises an upper holder 41 and a lower holder 45 that sandwich the shaft sealing body 20. The upper holder 41 has a substantially tubular portion 41a and a flange portion 41b disposed on the lower surface of the tubular portion 41a. The upper holder 41 is provided with an external electrode 50 extending along the axial direction from a retaining surface 41c on the lower surface of the flange portion 41b for retaining the shaft sealing body 20 to part of the inner peripheral surface of the tubular portion 41a. The external electrode 50 is connected to the exterior of the device body 10. When voltage is applied to the external electrode 50, it can be applied to the upper electrode 22 of the shaft sealing body 20. Thus, the external electrode 50 is patterned on the front surface of the upper holder 41 that is a three-dimensional circuit-molded part.

The lower holder 45 has a substantially columnar portion 45a and a flange portion 45b disposed on the lower surface of the columnar portion 45a. The lower holder 45 is provided with an external electrode 51 extending along the axial direction from a retaining surface 45c for retaining the shaft sealing body 20 to part of the outer peripheral surface of the columnar portion 45a. The external electrode 51 is connected to the exterior of the device body 10. When voltage is applied to the external electrode 51, it can be applied to the lower electrode 23 of the shaft sealing body 20. Thus, similarly to the external electrode 50, the external electrode 51 is patterned on the front surface of the lower holder 45 with a three-dimensional circuit.

The outside diameter of the flange portions 41b and 45b of the upper and lower holders 41 and 45 is made substantially equal to the outside diameter of the shaft sealing body 20. In addition, the outside diameter of the columnar portion 45a of the lower holder 45 is made smaller than the inside diameter of the inner peripheral surface of the tubular portion 41a of the upper holder 41 and the inside diameter of the through-hole 21 of the shaft sealing body 20 to enable the columnar portion 45a to be inserted into the inner peripheral part of the tubular portion 41a.

By inserting a columnar portion 45d of the lower holder 45 into the through-hole 21 and the columnar portion 45a of the lower holder 45 into the tubular portion 41a of the upper holder 41, the shaft sealing body 20 is sandwiched between the flange portions 41b and 45b. As a result, the components can be made integral in a state in which the external electrodes 50 and 51 on the sides of the flange portions 41b and 45b have come into contact with the upper and lower electrodes 22 and 23 of the shaft sealing body 20, respectively. At this time, since the axially extending external electrodes 50 and 51 are disposed at circumferential positions opposed to each other, they are not brought into contact with each other do not induce any short circuit. In addition, in the presence of a bump gap, the electrode 51 does not short-circuit the external electrode 50 patterned on the upper holder flange portion lower side 41c. When voltage has been applied to the external electrodes 50 and 51 and given to the shaft sealing body 20, the shaft sealing body 20 is configured such that it is deformed in the circumferential direction to enable diameter enlargement.

The holders 41 and 45 can retain the shaft sealing body 20 while locally coming into pressure contact with it from the upper and lower directions and, in the presence of the pressure contact portions, it is possible to prevent a fluid from passing through the shaft sealing body and leaking and to perform electrical conduction. In addition, the portions other than the pressure contact portions have suitable gaps so as to enable the shaft sealing body 20 to be expanded or contracted freely. Furthermore, as shown in FIG. 2, the upper side of the inner peripheral surface of the tubular part 41*a* of the upper holder 41 and the upper side of the outer peripheral surface of the columnar part 45*a* of the lower holder 45 are provided respectively with grooves 54 and 55 to which wires not shown are connected. Thus, voltage can be applied from the exterior of the device body 10 to the electrodes 50 and 51 via the wires.

With the above configuration, the shaft sealing body 20 is used to enable provision of a structure of an EPAM that is an artificial muscle, and the entire structure has excellent characteristics such that a force generated at the time of the deformation of the shaft sealing body 20 can be enlarged and that the entire structure has a light weight, makes a drive structure simple and compact, allows the sound generated during the operation to be quiet and can be driven at a low voltage.

The shaft sealing body 20 attached to the holders 41 and 45 is attached to a attachment body 17 formed in a substantially tubular shape, and the attachment body 17 is attached to the inside of the housing 11. As a result, the shaft sealing body 20 can be disposed at an appropriate position within the device body 10. An O-ring 18 is provided between the attachment body 17 and the housing 11 for preventing occurrence of leakage from between them. In addition, the same effect can be obtained through integral provision of the attachment body 17 and the holder 41.

A power supply circuit 60 is connected to each of the external electrodes 50 and 51 so that voltage may be applied to the external electrodes 50 and 51 and provided therein with a variable source 61, a switch 62 and a variable resistor 63 and, when the switch 62 is turned on to close the circuit, voltages of different polarities are applied to the electrodes 22 and 23 of the shaft sealing body 20 to perform electric charge. When voltage of negative polarity has been applied to the external electrode 50 of the upper holder 41, for example, voltage of positive polarity is to be applied to the external electrode 51 of the lower holder 45. In addition, these voltages can be controlled with the variable source 61 or variable resistor 63.

Subsequently, the operation of the above embodiment of the shaft sealing device according to the present invention will be described. When the switch 62 has been turned on as shown in FIG. 3 from the state of FIG. 1, voltages of different polarities are applied to the external electrode 50 of the upper holder 41 and the external electrode 51 of the lower holder 45, respectively, and to the upper and lower electrodes 22 and 23 of the shaft sealing body 20, respectively. As a result, the shaft sealing body 20 is deformed as being expanded in the circumferential direction and, by this deformation, the abutting surface 24 of the shaft sealing body 20 is brought into pressure contact with the seating face 16 of the device body 10 to shaft-seal the flow passage between the leakage flow passages 13 and 14, thereby enabling the fluid to be sealed.

At this time, since adjustment of the variable source 61 or variable resistor 63 controls the amount of voltage (degree of voltage) to be applied or the applying time of the voltage (transient response) to enable the amount of deformation or deformation response time of the shaft sealing body 20 to be adjusted, the abutment surface 24 can be brought into contact with the seating face 16 with appropriate suppress strength, thereby enabling leakage to be effectively prevented and the shaft sealing effect to be heightened. In addition, by increasing the voltage gradually from the fluid leaked state to deform the shaft sealing body, it is possible to optionally control the state from a minute level of leaked state to a sealed state. Furthermore, by decreasing the voltage to be applied from the shaft sealed state little by little, it is possible to control so-called minute leakage that induces leakage, with the shaft sealed state maintained. Moreover, by continuously decreasing the voltage to be applied, it is possible to adjust by the shaft sealing body 20 the amount of a gap δ to be described later and, as a result, adjust the flow rate to a prescribed value. Thus, the device body 10 can control a minute level of fluid leakage amount in addition to the induction of fluid leakage or the control of the amount of leakage to zero.

On the other hand, when the switch 62 has been turned off as shown in FIG. 1 from the state of FIG. 3, an external discharge circuit, though not shown, discharges an electric charge from the upper and lower electrodes 22 and 23 of the shaft sealing body 20 via the external electrodes 50 and 51. As a result, the shaft sealing body 20 is brought to a nonconductive state and deformed as being reduced in diameter in the circumferential direction to form the concentric gap δ between the shaft sealing body 20 (abutting surface 24) and the housing 11 (seating face 16). The fluid kept still sealed is flowed as leaking from the gap δ to enable communication between the flow passages 13 and 14. In the case, since the amount of the gap δ at the time of turning the switch 62 off is peculiar to the device body 10, the amount of the fluid leaked peculiar to the device body can be produced and utilized as a constant fluid flow rate. As a result, the shaft sealing device can be applied to an electromagnetic valve, for example.

Thus, the device body 10 deforms the shaft sealing body 20 as being enlarged or reduced in diameter through application of external electro stimuli via the external electrodes 50 and 51. Therefore, the shaft sealing body 20 can seal the fluid in the shaft sealed state in which it is not moved, or flow the fluid while adjusting the amount of leakage after releasing the shaft sealed state. In addition, when an internal structure in which the shaft sealing body 20 constitutes a movable portion has been adopted, since there is no need to provide a moving mechanism, such as a screw feeding mechanism, sealing and unsealing of the fluid can easily be performed through a reversible switching operation. Furthermore, since the shaft sealing body 20 is not twisted at the moving time, it can be prevented from being injured or deteriorated and maintain an excellent shaft sealing function.

Incidentally, in this example, since the shaft sealing body is formed of an electro stimuli-responsive macromolecular material, it is deformed as being expanded or contracted when voltage has been applied thereto. However, when the shaft sealing body is formed of an electroconductive material, it is enlarged or reduced through the expansion or contraction thereof when voltage has been applied thereto. In addition, when the shaft sealing body is formed of an ionically conductive macromolecular material or an electro stimuli-responsive macromolecular material deforming a section other than a section to which external electro stimuli have been applied, it is deformed when voltage has been applied thereto. In addition, since either one of the leakage flow passages 13 and 14 may constitutes a primary or secondary flow passage, the fluid can be leaked or sealed in an optional direction.

Next, another example of the shaft sealing device according to the present invention will be described. Incidentally, in the following examples, the same portions as in the above example will be given the same reference numerals and the descriptions thereof will be omitted. In addition, also in this example, though the macromolecular material used as the shaft sealing body includes at least four kinds of macromolecular materials, i.e. one being an electro stimuli-responsive macromolecular material, another an electroconductive macromolecular material, another an ionically conductive macromolecular material and the remainder an electro stimuli-responsive macromolecular material deforming a section other than a section to which external electro stimuli have been applied, the case of using the electro stimuli-responsive macromolecular material will be described in this example for convenience of explanation.

Figure 6:
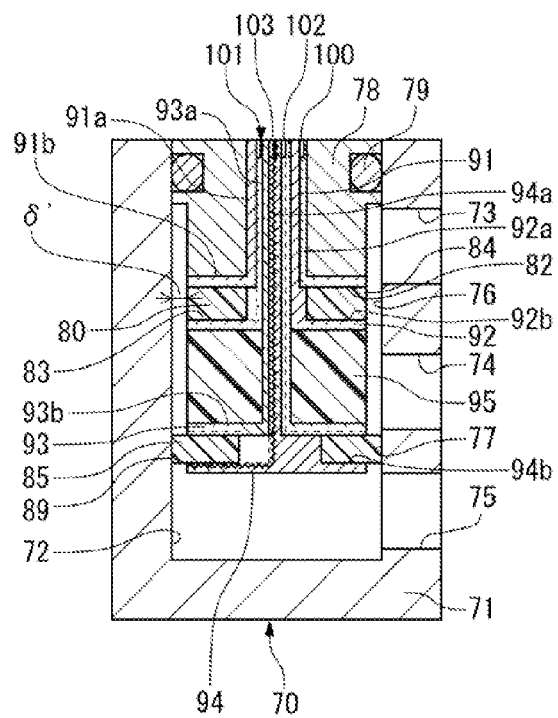
FIG. 6 is a cross section showing another example of the shaft sealing device according to the present invention.
Figure 7:
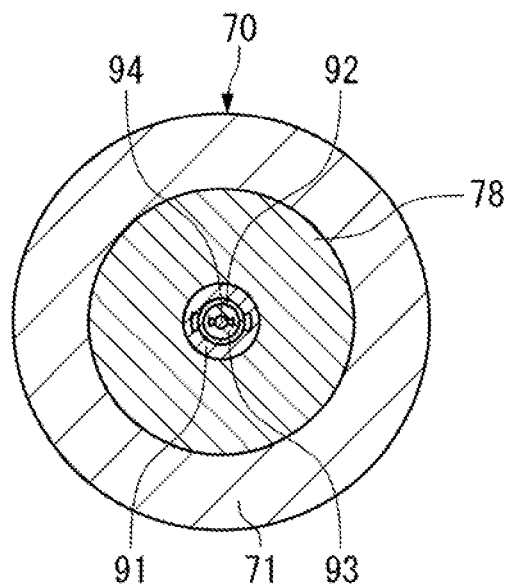
FIG. 7 is a plan view of FIG. 6.
Figure 8:
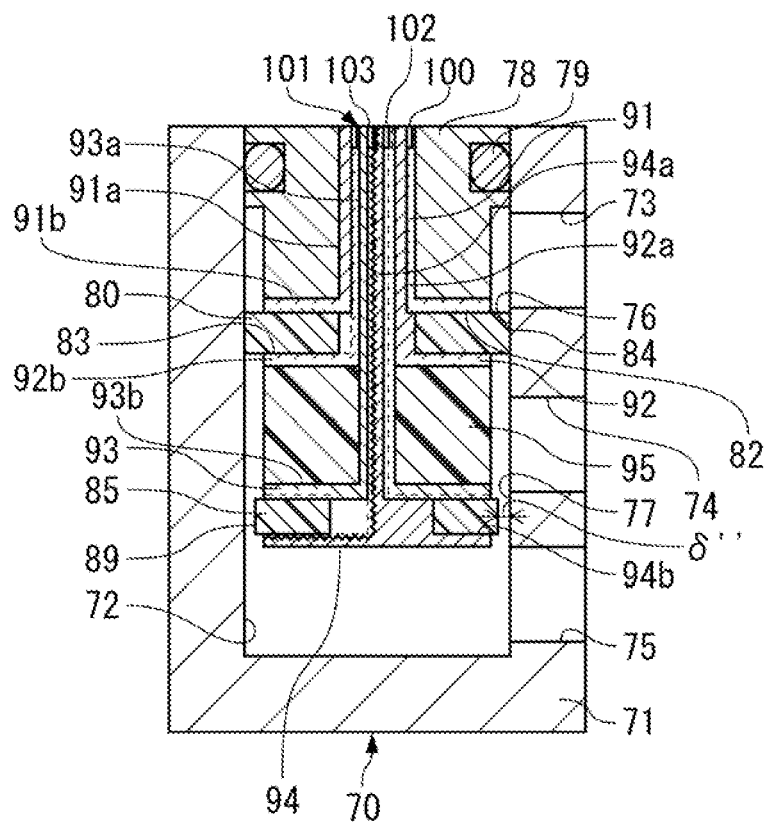
FIG. 8 is a cross section showing a movement state of the shaft sealing device of FIG. 6.

In this example, as shown in FIGS. 6 to 8, at least two shaft sealing bodies 80 and 85 are provided within a device body 70, a holder 90 capable of retaining the shaft sealing bodies 80 and 85 in the upper and lower directions, respectively, is provided, and retaining surfaces of the holder 90 for these shaft sealing bodies are provided with electrodes electrically connected to the exterior of the device body 70. By performing or stopping application of external electro stimuli from the electrodes to deform the shaft sealing bodies 80 and 85, at least three fluid flow passages 73, 74 and 75 formed in a substantially tubular housing 71 for the device body 70 can be switched.

Figure 9:
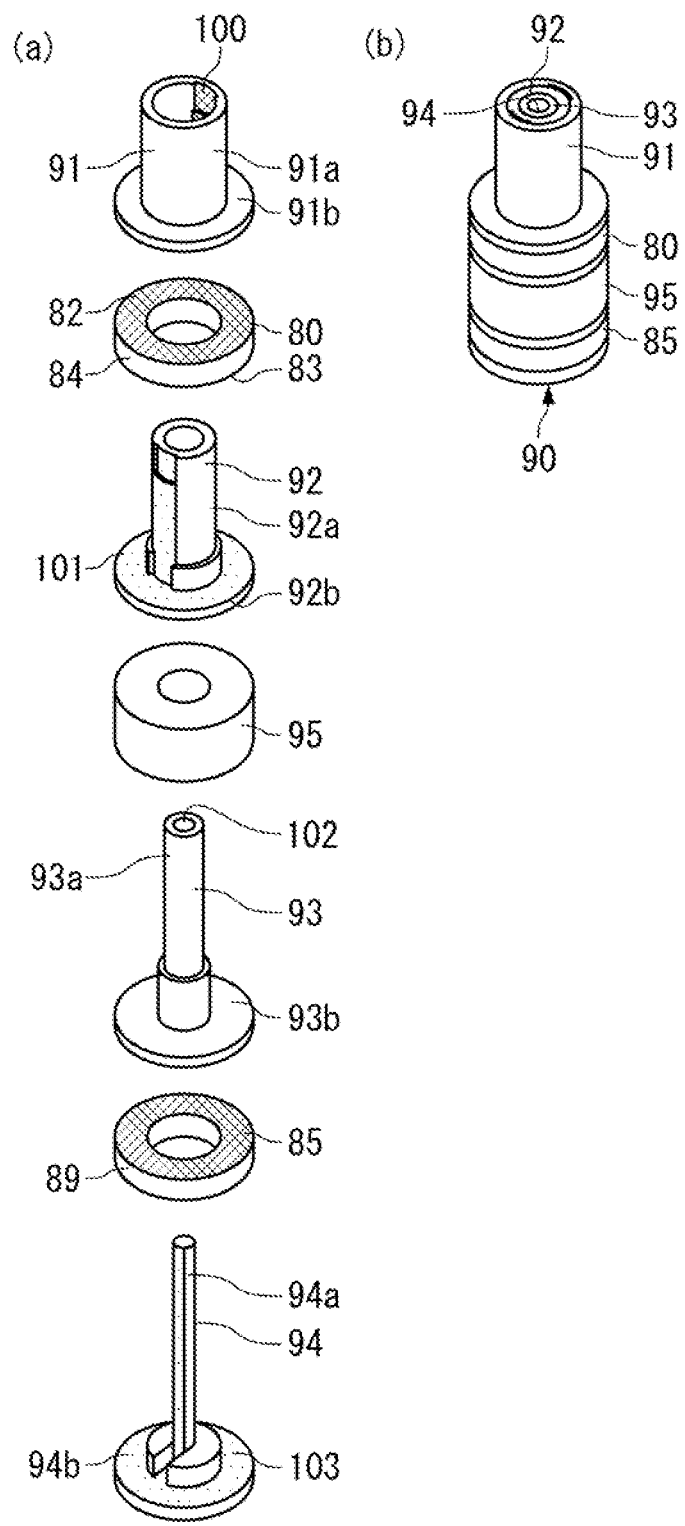
FIG. 9 includes top perspective views showing a different example of the sealing member, (a) being an exploded perspective view of the sealing member and (b) being a perspective view showing an assembled state of the sealing member.
Figure 10:
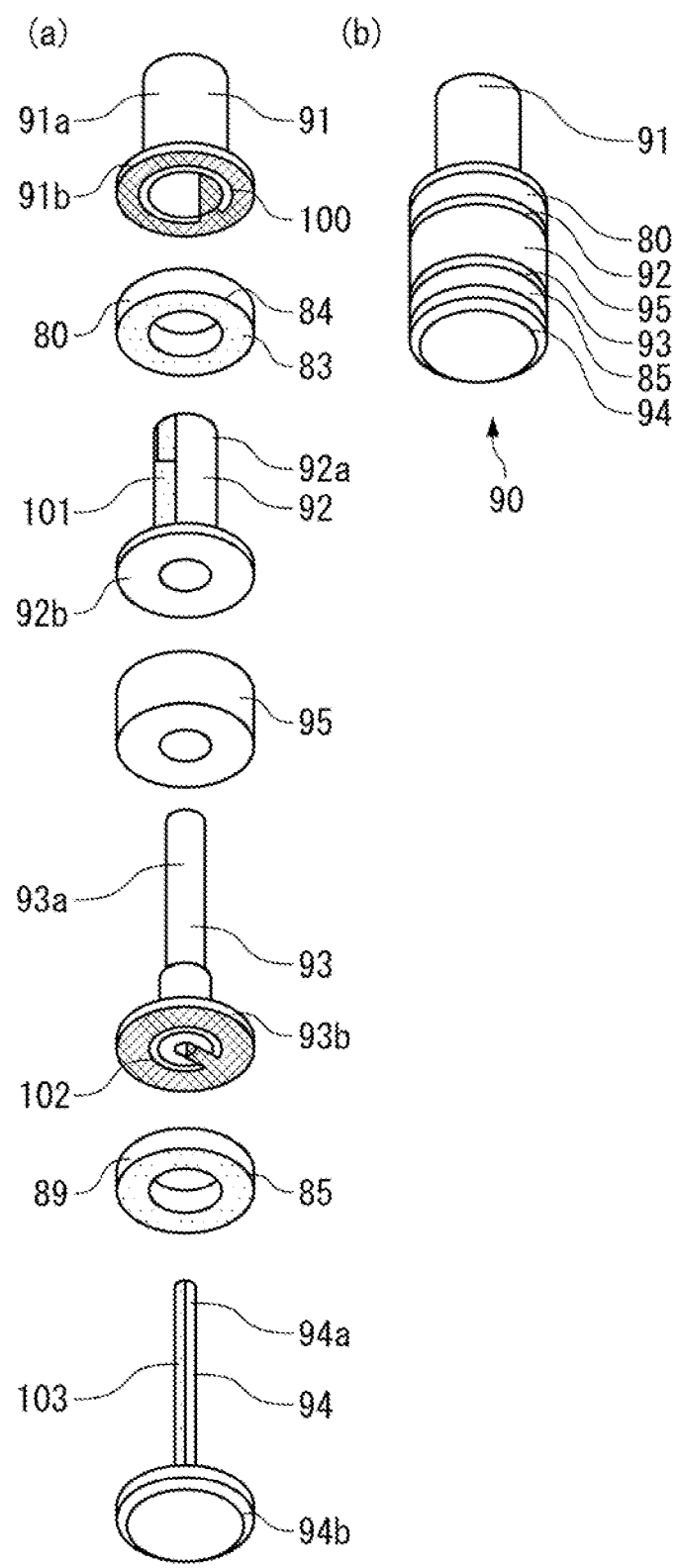
FIG. 10 includes bottom perspective views showing the different example of the sealing member, (a) being an exploded perspective view of the sealing member and (b) being a perspective view showing an assembled state of the sealing member.

As shown in FIGS. 9 and 10, the holder 90 comprises a first holder 91, a second holder 92, a third holder 93 and a fourth holder 94 and, between adjacent ones of these holders 91, 92, 93 and 94, the two shaft sealing bodies 80 and 85 and a separator 95 intervene, respectively. The first holder 91 has a substantially tubular portion 91a and a flange portion 91b on the lower side of the tubular portion 91a. An electrode 100 is formed to extend along the axial direction from the lower side of the flange portion 91b retaining the shaft sealing body 80 to part of the inner peripheral surface of the tubular portion 91a and is connected to the exterior of the device body 70. As a result, voltage applied from the upper side of the tubular portion 91a to the electrode 100 can be applied to an upper surface 82 of the shaft sealing body 80.

The second holder 92 has a substantially tubular portion 92a and a flange portion 92b on the lower side of the tubular portion 92a, and an electrode 101 is formed to extend along the axial direction from the upper side of the flange portion 92b to part of the outer peripheral surface of the tubular portion 92a and is connected to the exterior of the device body 70. As a result, when voltage has been applied from the electrode 101, it can be applied to a lower surface 83 of the shaft sealing body 80. The voltage has the opposite polarity to the voltage applied to the electrode 100.

The third holder 93 has a substantially tubular portion 93a and a flange portion 93b on the lower side of the tubular portion 93a, and an electrode 102 is formed to extend along the axial direction from the lower side of the flange portion 93b to part of the inner peripheral surface of the tubular portion 93a and is connected to the exterior of the device body 70. Furthermore, the fourth holder 94 has a substantially columnar portion 94a and a flange portion 94b on the lower side of the columnar portion 94a, and an electrode 103 is formed to extend along the axial direction from the upper side of the flange portion 94b to part of the outer peripheral surface of the columnar portion 94a and is connected to the exterior of the device body 70. The voltage in the electrode 103 of the fourth holder is opposite to that in the electrode 102 of the third holder.

The electrodes 100, 101, 102 and 103 of the holders 91, 92, 93 and 94 can be detached to the exterior from the upper sides of the tubular portions 91a, 92a and 93a and columnar portion 94a, respectively, and voltage can be applied from an external power circuit to each of the electrodes. Incidentally, the power source is not shown in this example, but the lead line therefor is only shown.

The outside diameter of the flange portions 91b, 92b, 93b and 94b is substantially equal to that of the shaft sealing bodies 80 and 85 and spacer 95. The outside diameter of the spacer 95 may be made smaller appropriately. In addition, it is designed that the relations of the inside diameter of the tubular portion of the first holder 91>the outside diameter of the tubular portion of the second holder 92, the inside diameter of the tubular portion of the second holder 92>the outside diameter of the tubular portion of the third holder 93 and the inside diameter of the tubular portion of the third holder 93>the outside diameter of the columnar portion of the fourth holder 94 have been satisfied. The shaft sealing bodies 80 and 85 and the spacer 95 have through-holes so as to be attached to, respectively, between the first and second holders 91 and 92, between the third and fourth holders 93 and 94 and between the second and third holders 92 and 93.

When making these components integral with one another, the tubular portions and columnar portion are inserted into the corresponding tubular portions disposed upward, respectively, with the shaft sealing body 80 intervening between the first and second holders 91 and 92, the shaft sealing body 85 between the third and fourth holders 93 and 94 and the spacer 95 between the second and third holders 92 and 93. At this time, it is configured that the electrodes 100 and 101 of the first and second holders 91 and 92 do not come into contact with the electrodes 102 and 103 of the third and fourth holders 93 and 94 and, when voltages have been applied to these electrodes, the voltages of different polarities are applied to the upper and lower surfaces of the shaft sealing bodies 80 and 85 to enable the shaft sealing bodies 80 and 85 to be enlarged in diameter in the circumferential direction, respectively. The shaft sealing bodies 80 and 85 made integral are attached to an attachment body 78 forming a substantially tubular shape in conjunction with the holder 90 and spacer 95, and the attachment body 78 is attached to the inside of the housing 71 via an O-ring 79. In the meanwhile, the attachment body 78 and the holder 91 may be made integral with each other.

In the state shown in FIG. 6, when the application of voltage to the electrodes 100 and 101 has been stopped and when voltage has been applied to the electrodes 102 and 103, the shaft sealing body 85 is deformed as being enlarged in diameter by the pressure to bring an abutting surface 89 of the shaft sealing body 85 into contact with a seating face 77, thereby closing a flow passage between the leakage flow passages 74 and 75. On the other hand, the shaft sealing body 80 between the leakage flow passages 73 and 74 is in non-conductive state to maintain a diameter-reduced state, thereby inducing a gap 6' between an abutting surface 84 and a seating face 76 and, therefore, the leakage flow passages 73 and 74 are allowed to communicate via the gap 6' with each other to form a leakage flow passage.

Stopping the application of voltage to the electrodes 102 and 103 from the state shown in FIG. 6 and applying voltage to the electrodes 100 and 101 brings about a state shown in FIG. 8. In the figure, since the shaft sealing body 85 is in a non-conductive state to become in a deformed state as being reduced in diameter, a gap 6" is formed between the abutting surface 89 and the seating face 77. On the other hand, the shaft sealing body 80 is in a conductive state to maintain a deformed state as being enlarged in diameter, thereby bringing the abutting surface 84 of the shaft sealing body 80 into pressure contact with the seating face 76. As a result, the flow passage between the leakage flow passages 73 and 74 is closed, whereas the flow passage between the leakage flow passages 74 and 75 becomes in a state communicating with each other. In this example, as described above, by providing the plural shaft sealing bodies 80 and 85 and controlling the application of voltage to deform the shaft sealing bodies 80 and 85 and bring the abutting surfaces 84 and 89 into contact with or separate them from the seating faces 76 and 77 provided between the adjacent leakage flow passages 73, 74 and 75, the leakage flow passages can be switched. Also in this case, similarly to the aforementioned example, control of the voltage to be applied varies the size of the gap δ" to enable the adjustment of the leakage flow rate and, furthermore, in the case of adjusting the voltage in the state of bringing the shaft sealing body into pressure contact with seating face, the amount of minute leakage can be controlled.

Figure 11:
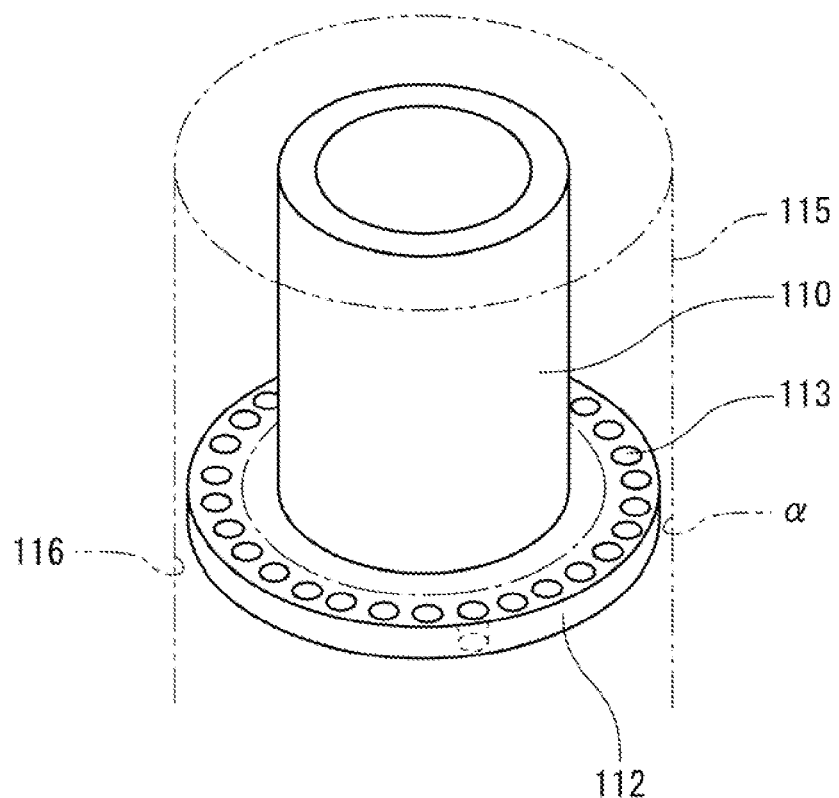
FIG. 11 is a perspective view showing the shape of a holder.

In FIG. 11, a holder 110 of a different shape is shown and configured to have a flange portion 112 provided on the outside diameter side thereof with plural bored holes 113 and, when having been accommodated within a shaft sealing portion 116 of a housing 115, form a gap α between the shaft sealing portion 116 and the outer periphery of the flange portion 112. Incidentally, in this example, the bored holes 113 are disposed in the circumferential direction of the flange portion 112 at positions on the outside diameter side thereof from the intermediate position thereof. The holder 110 can guide a shaft sealing body, not shown, when having been expanded or contracted, or deformed, to make the shape of the shaft sealing body stable and enable the flange portion 112 to serve as a guide when the shaft sealing body attached to the holder 110 is inserted into the housing 115.

When the shaft sealing body not shown is attached to the holder 110, the outside diameter of the shaft sealing body when having been contracted is set to be smaller than the positions of the bored holes 113 and, when the shaft sealing body attached to the holder 110 is contracted or deformed in the diameter-reducing direction, it is possible to secure (increase) the area for passage of a fluid, thereby making it possible to increase the amount of leakage (flow rate) at the time of shaft sealing leakage. On the other hand, when the shaft sealing body is expanded or deformed in the diameter-enlarging direction, it can stop up the bored holes 113 to close the flow passages, thereby making it possible to seal the fluid with exactitude. The flange portion may be formed with cancellous holes, for example, insofar as it can close the flow passages when the shaft sealing body has been increased in diameter or, when the shaft sealing body has been decreased in diameter, increase the area for the passage of the fluid. Thus, the mode of the holder does not matter. In addition, the above mode of the holder can be utilized for any of the aforementioned shaft sealing devices.

Figure 12:
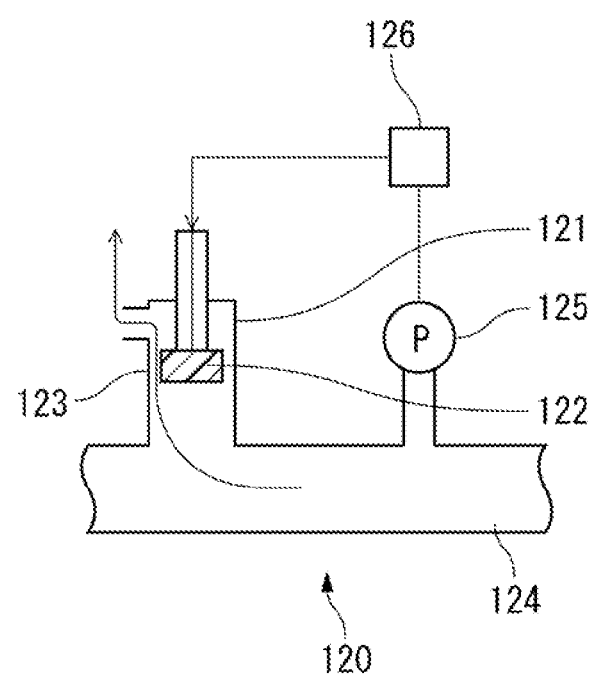
FIG. 12 is a schematic view showing an example in which the shaft sealing device of the present invention is applied to a safety valve.

FIG. 12 shows an example in which the shaft sealing body is applied to a safety valve 120. In the figure, a device body 121 has a shaft sealing body 122 capable of being expanded or contracted, or deformed, by performing or stopping the application of voltage, and the shaft sealing body 122 is accommodated in a housing 123. The housing 123 is attached to a pipe 124 so as to allow an internal flow passage thereof to communicate with the pipe. In addition, a pressure sensor 125 can transmit the fluctuation in internal pressure of the pipe 124 as a voltage signal and detect the variation in internal pressure of the pipe 124. A switch circuit 126 is disposed between the pressure sensor 125 and the device body 121 and configured to enable stopping the application of voltage to the device body 121 in accordance with the fluctuation of the pressure detected with the pressure sensor 125. Furthermore, to the switch circuit 126, voltage having a reference value for provisionally sealing the shaft sealing body during the course of the shaft sealing body 122 reaching a prescribed pressure value in an initial seal of pressure into the pipe is applied.

The safety valve 120 stops the application of voltage with the switch circuit 126 when the value of the internal pressure of the pipe 124 detected with the pressure sensor 125 has exceeded a prescribed value and, by the voltage application stopping, the shaft sealing body 122 is contracted or deformed from the normally expanded or deformed state to form a gap between the housing 123 for the device body 121 and the shaft sealing body 122, thereby enabling the internal pressure of the pipe 124 to be lowered through relief of the pressure from the gap. In addition, when the pressure has been returned to the prescribed value or less after the pressure relief, the switch circuit 126 is used to apply the voltage of the pressure sensor 125 to the shaft sealing body 122 to change the shaft sealing body 122 from the contracted or deformed state to the expanded or deformed state, thereby enabling sealing pressure leakage.

Figure 13:
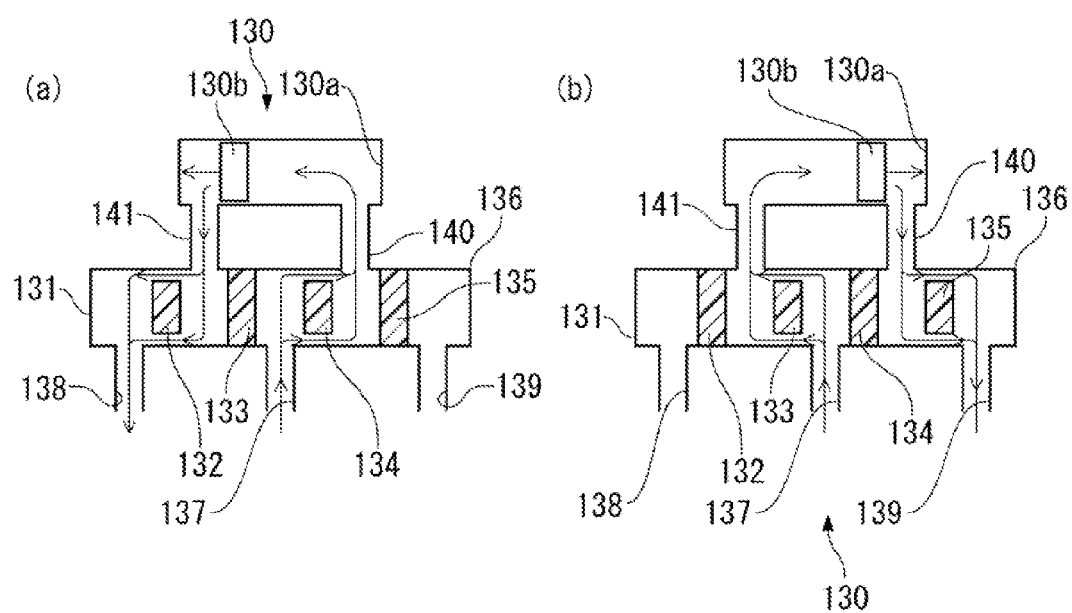
FIG. 13 includes schematic views showing an example in which the shaft sealing device of the present invention is applied to a piston-cylinder drive mechanism.

FIG. 13 shows an example in which the shaft sealing device of the present invention is applied to a piston-cylinder drive mechanism 130. In the figure, a device body 131 has four shaft sealing bodies 132, 133, 134 and 135 capable of being expanded or contracted, or deformed, in the circumferential direction accommodated in a housing 136 to enable air flow passages to be switched. The housing 136 is formed therein with leakage flow passages 137, 138, 139, 140 and 141. The leakage flow passage 137 is provided so as to enable compressed air to be supplied from the exterior to the device body 131, and the leakage flow passages 138 and 139 are provided so as to enable the compressed air within the device body 131 to be discharged to the exterior. In addition, the leakage flow passages 140 and 141 are connected to a cylinder portion 130a and provided so as to enable supply and discharge the compressed air between the device body 131 and the cylinder portion 130a.

The shaft sealing bodies 132, 133, 134 and 135 are disposed between the leakage flow passages 138 and 141, between the leakage flow passages 141 and 137, between the leakage flow passages 137 and 140 and between the leakage flow passages 140 and 139, respectively, and application of voltage to the shaft sealing bodies 132, 133, 134 and 135 is controlled to expand or contract, or deform, these shaft sealing bodies to enable a shaft seal between the adjacent leakage flow passages.

In FIG. 13(a), by making a control so that application of voltage to the shaft sealing bodies 132 and 134 is stopped to contract or deform these shaft sealing bodies in the diameter-reducing direction and so that voltage is applied to the shaft sealing bodies 133 and 135 to expand or deform these shaft sealing bodies in the diameter-enlarging direction, the flow passage between the leakage flow passages 137 and 140 and the flow passage between the leakage flow passages 141 and 138 are allowed to communicate with each other as shown and, at the same time, the flow passage between the leakage flow passages 139 and 140 and the flow passage between the leakage flow passages 141 and 137 are closed, respectively. When compressed air has been supplied from the leakage flow passage 137, with the above state maintained, the compressed air was sent into the cylinder portion 130a via the leakage flow passage 140 to move a piston 130b leftward in the figure. This movement of the piston 130b discharges the compressed air within the cylinder portion 130a from the leakage flow passage 138 via the leakage flow passage 141.

On the other hand, in FIG. 13(b), by making a control so that voltage is applied to the shaft sealing bodies 132 and 134 to expand or deform these shaft sealing bodies in the diameter-enlarging direction and so that application of voltage to the shaft sealing bodies 133 and 135 is stopped to contract or deform these shaft sealing bodies in the diameter-reducing direction, the flow passage between the leakage flow passages 137 and 141 and the flow passage between the leakage flow passages 140 and 139 are allowed to communicate with each other as shown and, at the same time, the flow passage between the leakage flow passages 141 and 138 and the flow passage between the leakage flow passages 137 and 140 are closed, respectively. When compressed air has been supplied from the leakage flow passage 137, with the above state maintained, the compressed air was sent into the cylinder portion 130a via the leakage flow passage 141 to move a piston 130b rightward in the figure. This movement of the piston 130b discharges the compressed air within the cylinder portion 130a from the leakage flow passage 139 via the leakage flow passage 140. Thus, in the piston-cylinder drive mechanism 130, it is possible to switch the flow passages through the control of the application of voltage to each of the shaft sealing bodies 132, 133, 134 and 135 and enable the piston 130b to reciprocate through the supply of the compressed air from one of the leakage flow passages 137.

Though the cases of providing the shaft sealing device of the present invention with the safety valve 120 and the piston-cylinder drive mechanism 130 have been described above, these are absolutely mere examples. The shaft sealing device of the present invention can shaft-seal the primary and secondary sides of a fluid flow passage and release the shaft seal to induce a prescribed leakage amount, and may be applied to various apparatus and mechanisms insofar as minute leakage can be controlled.

Though not shown, the shaft sealing device of the present invention may be configured have the shaft sealing portion formed like a room to constitute a shaft sealing chamber in which a fluid can be accommodated besides the configuration thereof as part of a flow passage. In addition, the device body may be formed of a material resistant to a drug solution or provided as an internal structure, thereby enabling supply of the drug solution while sealing the drug solution or controlling the flow rate of the drug solution. As a result, it is possible to provide the shaft sealing device as part of a liquid crystal fabricating plant or a semiconductor precision plant. In this case, the material for a pipe connected to an inlet or outlet side of the device can be selected freely and, in accordance with a fluid to be used, can be changed appropriately.

Next, a valve structure using the shaft sealing device will be described. In the shaft sealing device in this case, an annular shaft sealing body is inserted into a device body via a holder, the shaft sealing body has a base fixed to the holder or device body and an opposite free end and, when external electro stimuli have been applied to the shaft sealing body, the shaft sealing body is expanded or contracted in the shape of a substantially perfect circle, with the free end as a shaft sealing portion, thereby obtaining a shaft sealed state or a fluid leaked state.

In the valve structure using the shaft sealing device, the device body is formed therein with plural flow passages communicating with the exterior, and the shaft sealing portion that are the free end of the shaft sealing body is disposed between the flow passages to bring the shaft sealing portion to a shaft sealed state or liquid leaked state, thereby enabling switching the flow passages.

In FIG. 23, macromolecular materials of which the shaft sealing body is formed and which are used in the valve structure are shown. The macromolecular materials used in the valve structure can be expanded or deformed through external electro stimuli similarly in the case of the aforementioned shaft sealing device and includes at least three kinds of materials, i.e. one being an electro stimuli-responsive macromolecular material, another an electroconductive macromolecular material and the remainder an ionically conductive macromolecular material. The characteristics of these macromolecular materials are the same as those of the aforementioned macromolecular materials. Though the description of an electro stimuli-responsive macromolecular material having a section, other than a section to which external electro stimuli have been applied, deformed is omitted, this macromolecular material having an appropriate configuration can be utilized in the valve structure using the shaft sealing device, similarly to the three kinds of the macromolecular materials described herein below. The characteristics of the macromolecular material are the same as those of the aforementioned macromolecular material.

In the shaft sealing body using the electro stimuli-responsive macromolecular material or ionically conductive macromolecular material as the macromolecular material, a plate-shaped base is provided on the front and back surfaces thereof with electrodes, respectively and, in the case of using an electroconductive macromolecular material as the macromolecular material, there is no need to provide the front and back surfaces of the plate-like base with electrodes, but the plate-like base is molded into an annular shape. In addition, the shaft sealing body, if formed of an electro stimuli-responsive macromolecular material or an ionically conductive material, is provided on hollow cylindrical inner and outer peripheral surfaces thereof integrally with electrodes, respectively. FIGS. 24 to 26 are schematic views showing a plate-shaped base material of a shaft sealing body formed into an annular shape.

The valve structure in FIG. 24 has a shaft sealing body 160A which is formed of an electro stimuli-responsive macromolecular material and which has a plate-like base material 161A having electrodes 162A and 163A patterned on the outer and inner peripheries thereof. The base material 161A is formed in a concentric hollow cylindrical shape. A separator 168A formed of a material having compliant characteristics, such as a resin, is attached integrally to the outer periphery of the shaft sealing body 160A to allow the separator 168A and the shaft sealing body 160A to be operated integrally.

A holder 170A retains the shaft sealing body 160A from the inner periphery thereof so that voltage may be applied from the exterior to the electrodes 162A and 163A of the shaft sealing body 160A via communication holes 171A and 172A formed in the holder 170A and through-holes 164A and 165A formed in the shaft sealing body 160A. In addition, the shaft sealing body 160A has the through-holes 164A and 165A fixed to the communication holes 171A and 172A of the holder 170A to form a base 166A and has a free end 167A, opposite to the base 166A, enabled to expansion-deform in the shape of a substantially perfect circle relative to the holder 170A.

In the valve structure, when a power source not shown has been turned on and a potential difference has been given to between the electrodes 162A and 163A on the outer and inner peripheries of the tubular shaft sealing body 160A, the shaft sealing body 160A is deformed in a direction of being expanded in the axial direction. At this time, since the shaft sealing body 160A has its surface on the side of the separator 168A maintained, the shape of the inner periphery on the side opposite to the side of the separator 168A is more expanded. Therefore, as shown in FIGS. 23 and 24(a), the shaft sealing body 160A has the free end 167A, except for the base 166A, is deformed as being enlarged in diameter relative to the holder 170A maintaining a reference cylindrical shape. In addition, when the potential difference has been eliminated, as shown in FIG. 24(b), the free end 167A of the shaft sealing body is returned to the original position as being deformed to reduce its diameter along the holder 170A.

Furthermore, the valve structure in FIGS. 25 and 26 has a shaft sealing body 160B formed of an electroconductive macromolecular material and, in this case, there is no need to provide the shaft sealing body with electrodes, and a base material 161B is formed into a concentric hollow cylindrical shape. A separator 168B is formed of a resin similarly to the case of FIG. 24. The separator 168B adheres integrally to the outer periphery of the shaft sealing body 160B in FIG. 25 and to the inner periphery of the shaft sealing body 160B in FIG. 26.

A holder 170B retains the shaft sealing body 160B from the inner periphery thereof, and it is configured that voltage can be applied from the exterior to the outer and inner peripheral surfaces 162B and 163B of the shaft sealing body 160B via communication holes 171B and 172B formed in the holder 170B and through-holes 164B and 165B formed in the shaft sealing body 160B. In addition, the shaft sealing body 160B has the through-holes 164B and 165B fixed to the communication holes 171B and 172B of the holder 170B to form a base 166B, and a free end 167B opposite to the base 166B can be expanded or contracted, or deformed, in the shape of a substantially perfect circle relative to the holder 170B.

In the valve structure of FIG. 25, when a potential difference has been give to between the outer and inner peripheral surfaces 162B and 163B of the shaft sealing body 160B, the shaft sealing body 160 is urged to expand in the axial direction. At this time, since the shape of the shaft sealing body 160B on the side of the separator 168B is maintained, the inner periphery of the shaft sealing device on the side opposite to the side of the separator 168B is more expanded. As shown in FIGS. 23 and 25(b), therefore, the shaft sealing body 160B has the free end 167B, except for the base 166, enlarged in diameter relative to and along the holder 170A assuming the reference cylindrical shape. When the potential difference has been eliminated, as shown in FIG. 25(a), the free end 167B is returned to the original position as being contracted.

On the other hand, in the valve structure of FIG. 26, when a potential difference has been give to between the outer and inner peripheral surfaces 162B and 163B of the shaft sealing body 160B, the shaft sealing body 160B is urged to contract in the axial direction. At this time, since the shape of the shaft sealing body 160B on the side of the separator 168B is maintained, the outer periphery of the shaft sealing device on the side opposite to the side of the separator 168B is more contracted. As shown in FIGS. 23 and 26(a), therefore, the shaft sealing body 160B has the free end 167B, except for the base 166B, enlarged in diameter relative to the holder 170B. When the potential difference has been eliminated, as shown in FIG. 26(b), the free end 167B is returned to the original position as being expanded relative to and along the holder 170B.

The valve structure in FIG. 27 has a shaft sealing body 160C formed of an ionically conductive macromolecular material and, similarly to the case of the electro stimuli-responsive macromolecular material, a plate-like base material 161C has electrodes 162C and 163C patterned on the outer and inner peripheries thereof and is formed in a concentric hollow cylindrical shape. Similarly to the shaft sealing device of FIG. 19, there is no need to attach a separator to the shaft sealing body 160C. However, the separator may be attached as occasion demands.

A holder 170C retains the shaft sealing body 160C from the inner periphery thereof, and it is configured that voltage can be applied from the exterior to the electrodes 162C and 163C via communication holes 171C and 172C formed in the holder 170C and through-holes 164C and 165C formed in the shaft sealing body 160C. In addition, the shaft sealing body 160C has the through-holes 164C and 165C fixed to the communication holes 171C and 172C of the holder 170C to form a base 166C, and a free end 167C opposite to the base 166C can be expanded or contracted, or deformed, in the shape of a substantially perfect circle relative to the holder 170C.

In the valve structure of FIG. 27, when a potential difference has been given to between the electrodes 162C and 163C on the outer and inner peripheries of the shaft sealing body 160C, since the shaft sealing body 160C has the inner peripheral surface expanded and the outer peripheral surface contracted, the free end 167, except for the base 166C, assumes a shape having the distal end thereof more expanded as shown in FIG. 27(a). In addition, when the potential difference has been eliminated, as shown in FIG. 27(b), the free end 167C is returned to the original position as extending along the holder 170C.

Figure 28:
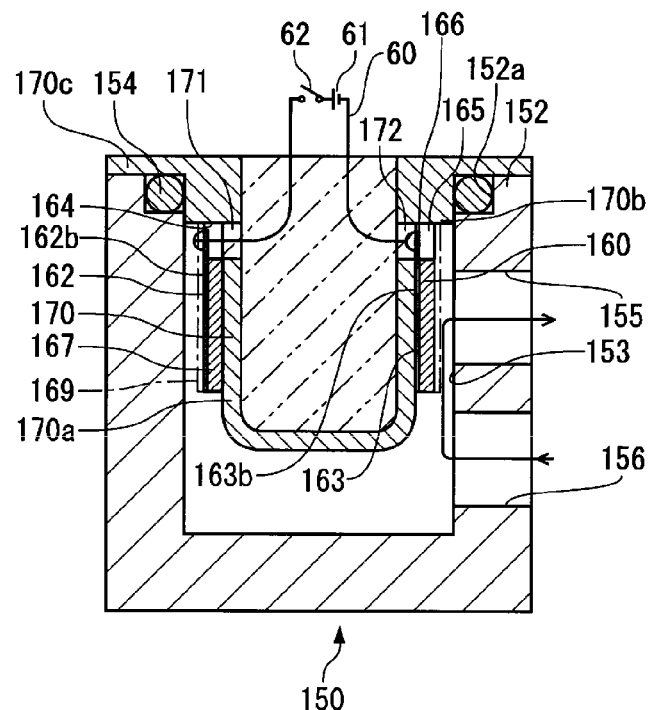
FIG. 28 is a cross section showing one example of a valve structure using a shaft sealing device.
Figure 29:
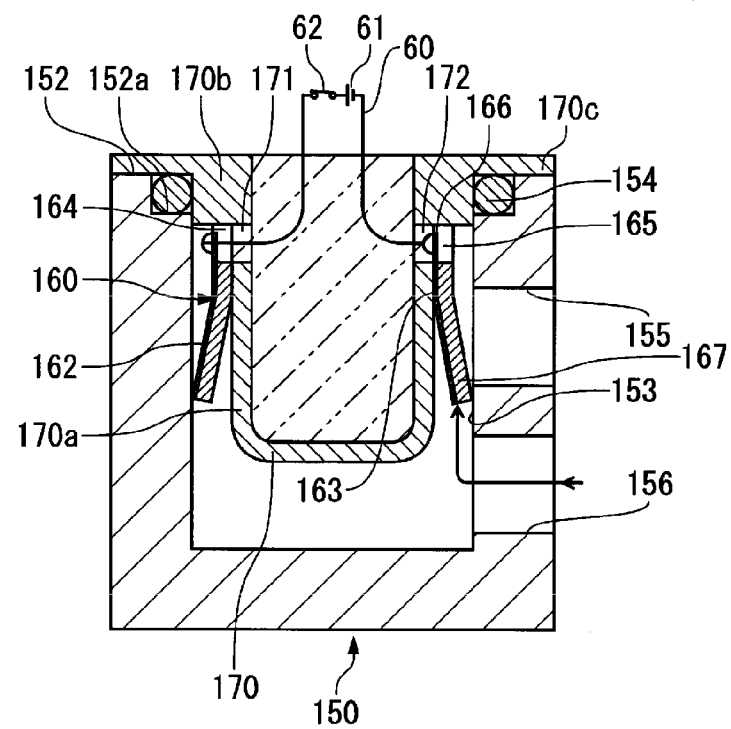
FIG. 29 is a cross section showing a sealed state of the valve structure of FIG. 28.

Next, the switching operation of the flow passages in the valve structure will be described using a typical example selected from the above examples. FIGS. 28 to 30 show one example of the valve structure using the shaft sealing device. As shown in FIGS. 30(b) and 30(c), a shaft sealing body 160 has front and back surfaces 161a and 161b of a base material 161 provided with electrodes 162 and 163, respectively, and has the base material 161 molded into an annular shape as shown in FIG. 30(a). FIG. 30(b) is a development view having the shaft sealing body 160 developed, with line ab-a'b' in FIG. 30(a) as a cutting-plane line, and a hatched portion in the figure denotes the electrode 162. In addition, FIG. 30(c) is a development view showing the backside of FIG. 30(a), and a hatched portion in the figure denotes the electrode 163.

The electrodes 162 and 163 have belt-like electrodes 162a and 163a, respectively, each having a width one half the width of the shaft sealing body 160 in the axial direction and, when the shaft sealing body 160 is molded into a perfect circle, the belt-like electrodes 162a and 163a are formed on the front and back surfaces 161a and 162a describing circumferences, respectively. Extraction electrodes 162b and 163b drawn from and connected to the belt-like electrodes 162a and 163a, respectively, are provided with through-holes 164 and 165 opposed to each other, whereby voltage can be applied to the entire electrodes from the through-holes 164 and 165 via the extraction electrodes 162b and 163b. Since the configuration is such that voltage is applied to the electrodes 162 and 163 on the front and back surfaces via the through-holes 164 and 165 as described above, the electrodes 162 and 163 are not short-circuited, and it is possible to apply voltages of opposite polarities to the front and back surfaces 161a and 161b of the shaft sealing body 160.

A holder 170 comprises a substantially circular portion 170a, a diameter-increasing portion 170b slightly larger in diameter than the cylindrical portion 170a and a lid portion 170c larger in diameter than the diameter-increasing portion 170b. The cylindrical portion 170a has an outside diameter not shown but made slightly smaller than the inside diameter, not shown, of the shaft sealing body 160 and has the outer periphery thereof to which the shaft sealing body 160 can be attached. In addition, the diameter-increasing portion 170b has an outside diameter not shown but made substantially equal or slightly smaller than the inside diameter, not shown, of a device body 150 and can be inserted into the inside diameter of the device body 150. The lid portion 170c has an outside diameter capable of covering an opening end 152 of the device body 150. Furthermore, the holder 170 is formed with communication holes 171 and 172 at positions corresponding to those of the through-holes 164 and 165 of the shaft sealing body 160 and, via the communication holes 171 and 172, wires can be connected from the power supply circuit 60 to the electrodes 162 and 163, respectively.

The power supply circuit 60 has the power source 61 and switch 62 and, when the switch 62 has been turned on, the circuit is closed to enable voltage to be applied to the electrodes 162 and 163. The circuit 60 may be provided therein with a variable resistor not shown to enable the voltage to be adjusted. In addition, the polarities of the power source 61 are not limited to those shown in FIGS. 28 and 29, but may be vise versa.

The shaft sealing body 160 is attached to the position of the diameter-increasing portion 170*b* of the holder 170 while subjecting the through-holes 164 and 165 and the communication holes 171 and 172 to alignment with each other, respectively, thereby enabling the shaft sealing body 160 to the holder 170 in an appropriately positioned state, and it is possible to connect the power supply circuit 167 from the inside of the holder 170 to the electrodes 162 and 163 via the communication holes 171 and 172. This connection can be attained by connecting the electrode 163 to the extraction electrode 163*b* on the inner peripheral side via the communication hole 172, whereas the electrode 162 is connected to the extraction electrode 162*b* on the outer peripheral side in a state in which the communication hole 171 and through hole 164 are allowed to communicate with each other.

After the connection of the power supply circuit 60 to the electrodes 162 and 163, an appropriate fixing material is sealed in the through-holes 164 and 165 and communication holes 171 and 172 to fix a base 166 of the shaft sealing body 160 to the holder 170. A free end 167 opposite to the base 166 can be deformed as being enlarged or reduced in diameter in the shape of a substantially perfect circle relative to the holder 170. In addition, the sealed-in fixing material seals the through-holes and communication holes, thereby preventing a fluid from entering the holder 170. Furthermore, the inside of the holder 170 may be filled with a potting material shown by two-dot chain lines.

The shaft sealing body 160 is inserted via the holder 170 into the device body 150 and, at the time the insertion, the diameter-increasing portion 170*b* is inserted until the lid portion 170*c* of the holder 170 is abutted on the opening end 152 of the device body, thereby obtaining the appropriate position enabling the free end 167 to be abutted on a seating face that constitutes a valve seal. In addition, since the opening end 152 is formed with an annular groove 152*a* to which an O-ring 154 is attached, after the holder 170 and device body 150 are made integral with each other, the O-ring 154 seals between the device body 150 and the holder 170 to prevent a fluid from leaking between the two.

Furthermore, the cylindrical device body 150 is formed in the circumferential face direction with plural flow passages 155 and 156 communicating with the exterior, and the seating face 153 is provided between the flow passages 155 and 156. In the valve structure, when external electro stimuli have applied to the shaft sealing body 160, the free end 167 is expanded or contracted, or deformed, in the shape of a substantially perfect circle. By bringing the free end 167 that forms a shaft sealing portion into contact with or separating the same from the seating face 153 to obtain a shaft sealed state or fluid leakage state, thereby causing the flow passages 155 and 156 to be switchable.

When the switch 62 has been turned on from the state of FIG. 28, voltages of opposite polarities are applied to the electrodes 162 and 163. Since the shaft sealing body 160 is formed in a substantially cylindrical shape, with the opposite surfaces thereof provided with the electrodes 162 and 163, and has the base 166 fixed to the holder 170 and the free end 167, the shaft sealing body 160 is urged to deform as being enlarged in diameter in proportion as it goes to its distal end at the time of the application of voltage. As a result, the shaft sealing body 160 has the free end 167 enlarged in diameter in the circumferential direction more than the base 166, i.e. assumes a shape widening toward the end (a trumpet shape).

The shape in the diameter-enlarged state has a cross section in the direction orthogonal to the axis becomes a shape of a substantially perfect circle. The free end 167 of the shape of the substantially perfect circle is brought into circumferential pressure contact with the perfectly circular seating face 153 when higher voltage has been applied thereto to close between the passages 155 and 156, thereby enabling the shaft sealed state to be obtained. Furthermore, by controlling the applied voltage to be lowered little by little from the shaft sealed state, the minute leakage amount can be adjusted to the prescribed flow rate to enable the shaft sealing body 160 to be operated as a valving element.

On the other hand, when the switch has been turned off from the state of FIG. 29, the shaft sealing body 160 is in a nonconductive state and, as shown in FIG. 28, the free end 167 is returned to the original state in which it is deformed as being reduced in diameter and the entire shaft sealing body 160 assumes the substantially tubular shape. This deformation forms a gap between the shaft sealing body 160 and the device body 150 to allow the flow passages 155 and 156 to communicate with each other to enable the fluid to flow.

At this time, in order for the free end 167 to establish the shaft sealed state with exactitude, it is necessary process the seating face 153 with high precision to enhance the surface roughness and the dimensional precision including circularity and select a material suitable for sealing relative to the shaft sealing body 160 to form the device body 150 so as not to induce leakage. In this case, the device body is fabricated so that a gap between the device body 150 and the shaft sealing body 160 when the shaft sealing body 160 has been reduced in diameter may be around 0.5 mm and, as a result, a fluid can flow at the time of the diameter reduction and minute leakage induced when the shaft sealing body 160 has been enlarged or contracted in diameter can be controlled with high precision.

Incidentally, the shaft sealing body formed of the ionically conductive macromolecular material has been described in the valve structure using the shaft sealing device in this example. However, it goes without saying that the shaft sealing body may be formed of an electro stimuli-responsive macromolecular material, an electroconductive macromolecular material, an electro stimuli-responsive macromolecular material having a section, other than a section to which external electro stimuli have been applied, deformed, or other macromolecular material. In this case, a valve structure is adopted to meet each of the macromolecular materials to be used. When the shaft sealing body is formed of an electroconductive macromolecular material, for example, there is no need to provide the shaft sealing body with electrodes. In addition, when the shaft sealing body is formed of an electro stimuli-responsive macromolecular material or an electroconductive macromolecular material, a flexible separator 169 is attached to the macromolecular material on the side of the outer or inner periphery of the shaft sealing body 160.

Figure 31:
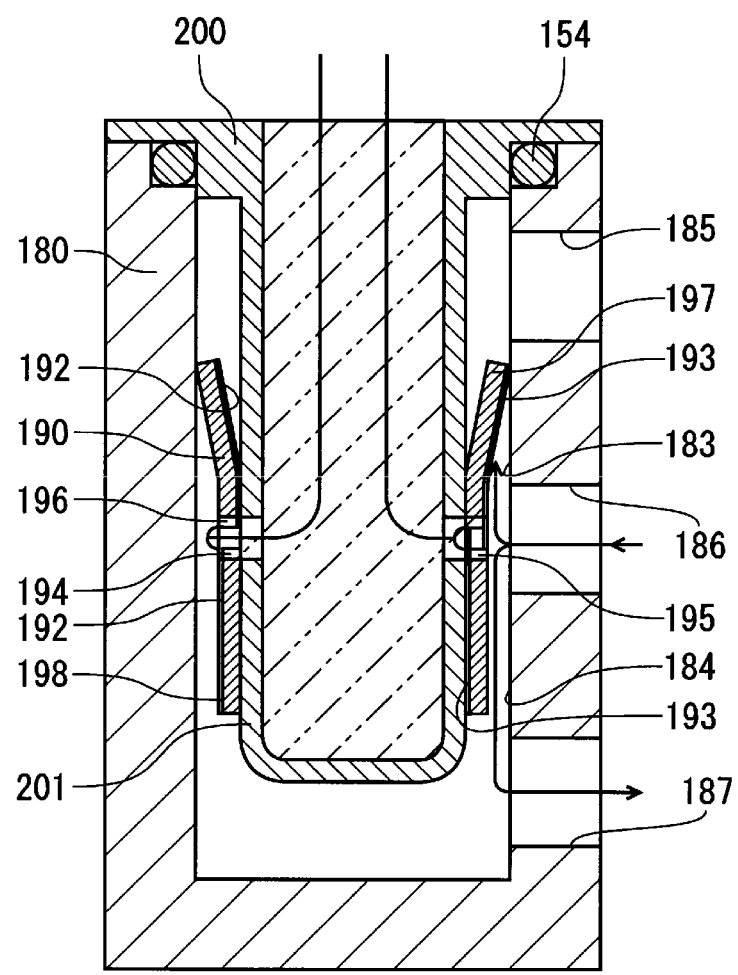
FIG. 31 is a cross section showing a different example in which the valve structure using the shaft sealing device has been applied to a multiway valve.
Figure 32:
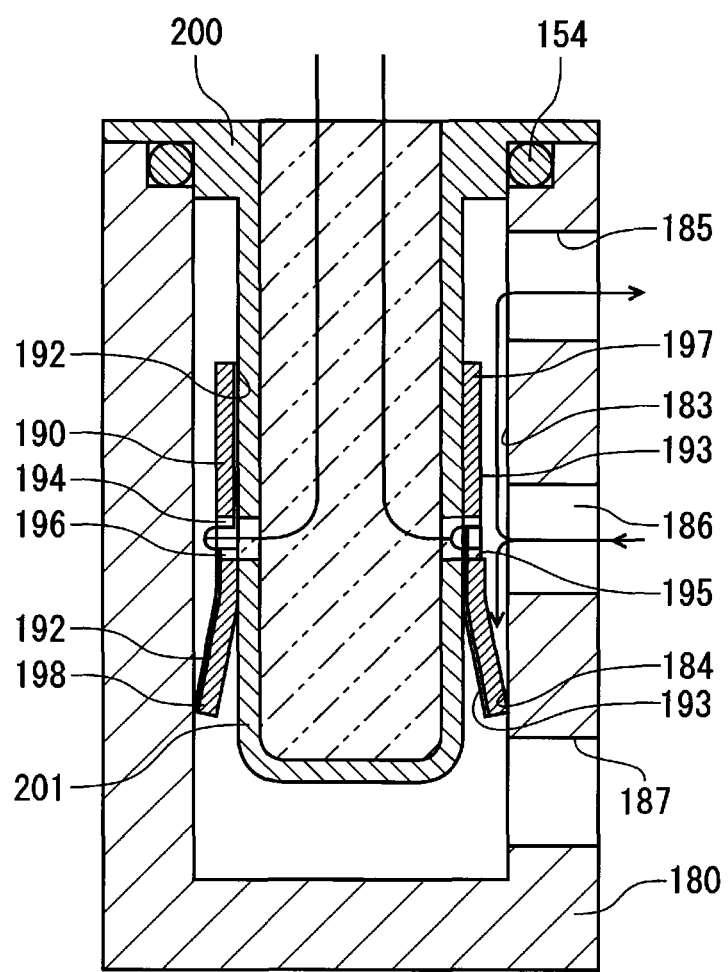
FIG. 32 is a cross section showing a state in which a flow passage has been switched in the valve structure of FIG. 31.

FIGS. 31 to 33 show an example in which the valve structure using the shaft sealing device is applied to a multiway valve. In the valve structure, a shaft sealing body 190 is formed of an ionically conductive macromolecular material and has a substantially central neighborhood thereof serving as a base 196 fixed to a cylindrical portion 201 of a holder 200 and opposite ends thereof serving as free ends 197 and 198. As shown in FIG. 33, the shaft sealing body 190 has front and back surfaces 191*a* and 191*b* of the axial opposite ends provided with belt-like electrodes 192*ai* and 192*a*2 and belt-like electrodes 193*ai* and 193*a*2, respectively, and extraction electrodes 192*b*1, 192*b*2, 193*b*1 and 193*b*2 extend from the belt-like electrodes 192*ai*, 192*a*2, 193*ai* and 193*a*2 to the axial central neighborhood, thereby constituting electrodes 192 and 193. At this time, electrodes of the same polarity are disposed on different ends of the front and back surfaces 191*a* and 191*b* of the shaft sealing body 190 via one through-hole, and voltages of the same polarity can be applied from one through-hole to the electrode on the front surface 191*a* of one end and to the electrode on the back surface 191*b* of the other end.

For example, since a through-hole 194 is connected to the extraction electrodes 192*b*1 and 192*b*2 and since the extraction electrodes 192*b*1 and 192*b*2 are connected to belt-like electrodes 192*ai* and 192*a*2, it is possible to apply voltage from the through-hole 194 to the electrodes 192 and 192 on the front and back surfaces at the same time. On the other hand, since electrodes are similarly configured with respect to a through-hole 195, voltage can simultaneously be applied from the through-hole 195 to the electrodes 193 and 193 on the front and back surfaces. Furthermore, in this example, since the polarities of a power supply circuit not shown can be switched, voltages of opposite polarities can be applied to the electrodes 192 and 193, respectively.

A device body 180 has three flow passages 185, 186 and 187 formed therein in a circumferential direction and two inner cylindrical annular portions (seating faces) 183 and 184 formed on the inner periphery thereof and sandwiched between the adjacent two of the three flow passages 185, 186 and 187. When the shaft sealing body 190 has been inserted into the device body 180 via the holder 200, the two free ends 197 and 198 are disposed at the positions of the two inner cylindrical annular portions 183 and 184 and, when voltage has been applied to expand or contract the free ends 197 and 198, the free ends 197 and 198 are brought into contact with or separated from the inner cylindrical annular portions 183 and 184, as shaft sealing portions, thereby enabling switching the flow passages 185, 186 and 187.

FIG. 31 shows a state, in which voltages have been applied to the front and back surfaces of the free end 197 so that the front side of the free end 197 may be contracted relative to the shaft sealing body 190 and the back side thereof may simultaneously be expanded relative to the same. At this time, the free end 197 is brought into pressure contact with the inner cylindrical annular portion 183 while being enlarged in diameter and maintaining the shape of a substantially perfect circle, thereby obtaining a shaft-sealed state. On the other hand, since voltage of an opposite polarity to that applied to the free end 197 has been applied to the front and back surfaces of the free end 198, the free end 198 is urged to have the front side expanded and the back side contracted. As a result, the free end 198 is contracted in the inside diameter direction and brought to a state in which the free end is separated from the inner cylindrical annular portion 184. Consequently, a space between the flow passages 185 and 186 is shaft-sealed with a circumferential seal by the free end 197, whereas a gap is formed between the flow passages 186 and 187 communicating with each other to enable a fluid to flow from the flow passage 186 to the flow passage 187 as shown in the figure.

On the other hand, in FIG. 32, the polarities of voltages from the power supply circuit are switched to apply voltage of a polarity, which enables the front surface of the free end 197 to be expanded and the back surface thereof to be contracted, to the free end and apply voltage of a polarity, which enables the front surface of the free end 198 to be contracted and the back surface thereof to be expanded, to the free end. In this case, the free end 197 is contracted in the inside diameter direction to separate from the inner cylindrical annular portion, whereas the free end 198 is urged to enlarge its diameter while maintaining the shape of a substantially perfect circle.

Consequently, a gap is formed between the flow passages 185 and 186 and, at the same time, a space between the flow passages 186 and 187 is shaft-sealed to enable a fluid to flow from the flow passage 186 to the flow passage 185. With this valve structure, since it is possible to seal the inner cylindrical annular portions 183 and 184 of the cylindrical device body 180 and switch the fluid from the flow passage 186 to the flow passage 185 or 187, it is possible to provide an on-off valve having a simple and compact structure and capable of being fabricated at low cost.

Incidentally, when the opposite ends of the shaft sealing body are made free, by forming the shaft sealing body of the ionically conductive macromolecular material or electro stimuli-responsive macromolecular material having a section, other than a section to which external electro stimuli have been applied, deformed, as is done in this embodiment, the application of voltage enables the opposite side free ends to be expanded and contracted, respectively, even in the case where the front and back surfaces of the base material are provided with electrodes of opposite polarities at the opposite free ends. This is because the ionically conductive macromolecular material can reverse its deformation (expansion or contraction) direction by changing the polarity of the voltage to be applied. When using an electro stimuli-responsive macromolecular material or electroconductive macromolecular material and making the opposite ends free, however, the deformation direction or expansion or contraction direction of the macromolecular materials at the time of performing or stopping the application voltage is decided irrespective of a difference in polarity, it is impossible that the opposite free ends of a single base material are deformed (expanded or contracted) in different directions. Therefore, when using each of these macromolecular materials and making the opposite ends free, two base materials of the same material are attached to the inner or outer peripheral surface of the macromolecular material to obtain an integral body, an electrode is disposed on each of the base materials and, with this state maintained, the entirety is attached to the holder.

Figure 34:
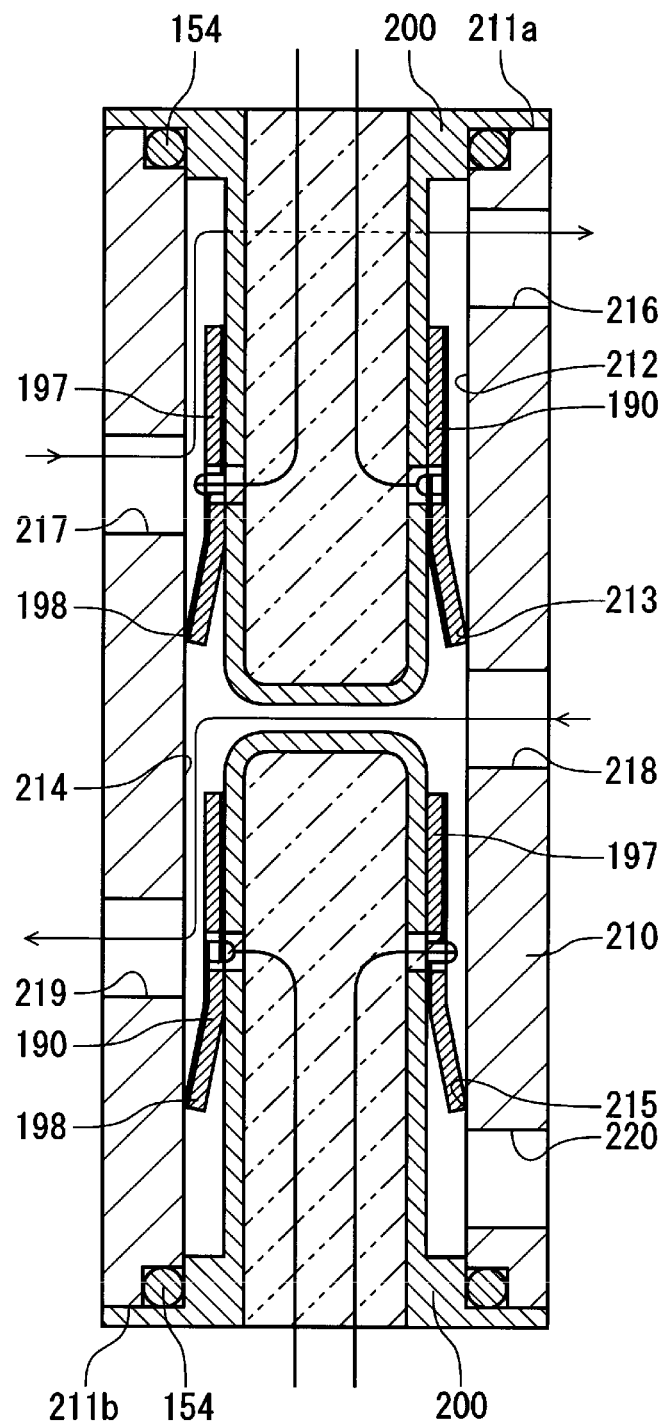
FIG. 34 is a cross section showing another example in which the valve structure using the shaft sealing device has been applied to a multiway valve.
Figure 35:
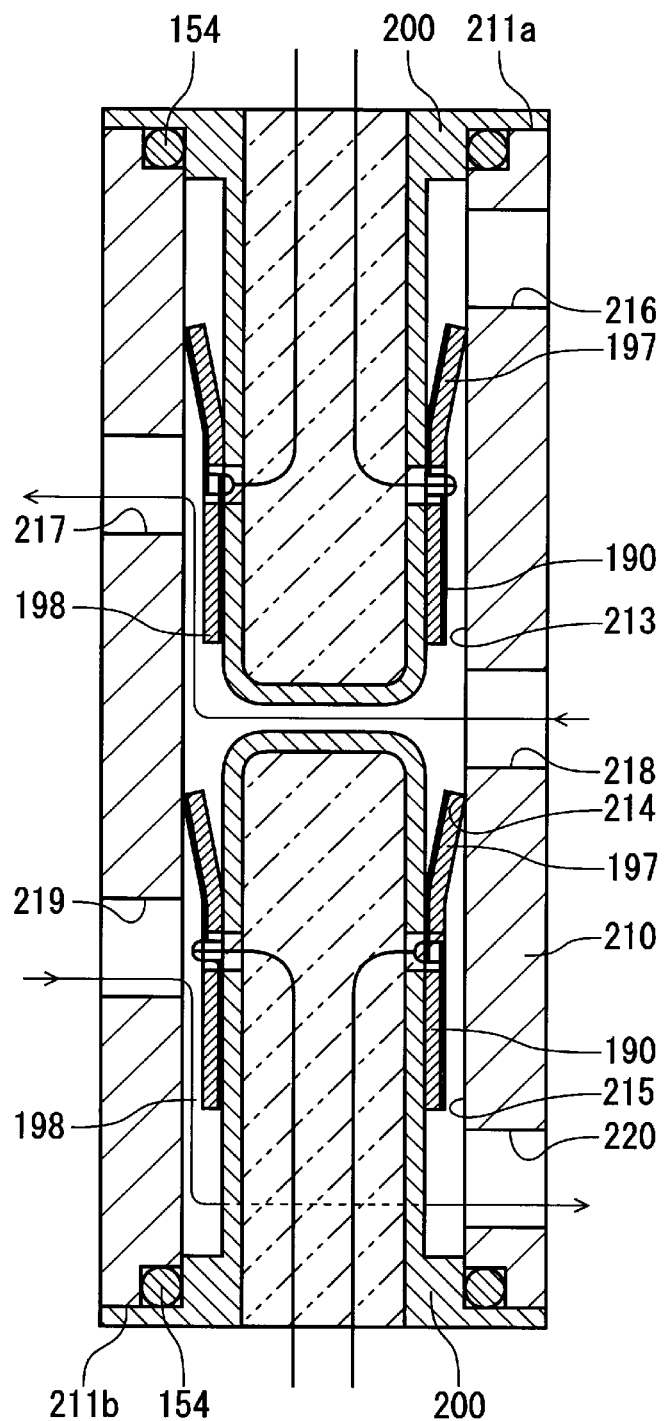
FIG. 35 is a cross section showing a state in which the flow passage has been switched in the valve structure of FIG. 34.

Subsequently, FIGS. 34 and 35 show another example in which the valve structure using the shaft sealing device is applied to a multiway valve. In this example, the valve structure has two shaft sealing devices of FIG. 31 continuously disposed in the axial direction, and the free end of each shaft sealing body is used as a shaft sealing portion that is brought to a shaft-sealed state or fluid leakage state, thereby making a large number of fluid passages switchable.

In the valve structure, a device body 210 is formed with five flow passages 216, 217, 218, 219 and 220 in the circumferential direction and four inner cylindrical annular portions (seating faces) 212, 213, 214 and 215 each sandwiched between adjacent two of the flow passages 216, 217, 218, 219 and 220. The holders 200 each having the shaft sealing body 190 attached thereto are inserted from two opening ends 211*a* and 211*b* into the device body 210, respectively, to bring the free ends 197 and 198 of the shaft sealing bodies 190 and 190 into contact with or separate them from the inner cylindrical annular portions 212, 213, 214 and 215, thereby making it possible to switch the five flow passages. In addition, different power supply circuits are connected to the shaft sealing bodies 190 to enable the shaft sealing bodies 190 to be operated individually.

In FIG. 34, voltages of polarities capable of contracting the free end 197 of the upper shaft sealing body 190 in diameter and, at the same time, enlarging the free end 198 in diameter are applied from the power supply circuits, and voltages of polarities capable of contracting the free end 197 of the lower shaft sealing body 190 in diameter and, at the same time, enlarging the free end 198 are applied from the power supply circuits. In this case, the flow passages 218 and 219 are allowed to communicate with each other, the flow passages 216 and 217 are also allowed to communicate with each other, and spaces between other flow passages are brought to a shaft-sealed state. As a result, a fluid can be flowed from the flow passage 218 to the flow passage 219 and from the flow passage 217 to the flow passage 216.

On the other hand, in FIG. 35, voltages of polarities capable of enlarging the free end 197 of the upper shaft sealing body 190 in diameter and, at the same time, contracting the free end 198 in diameter are applied from the power supply circuits, and voltages of polarities capable of enlarging the free end 197 of the lower shaft sealing body 190 in diameter and, at the same time, contracting the free end 198 are applied from the power supply circuits. In this case, the flow passages 218 and 217 are allowed to communicate with each other, the flow passages 219 and 220 are also allowed to communicate with each other, and spaces between other flow passages are brought to a shaft-sealed state. As a result, a fluid can be flowed from the flow passage 218 to the flow passage 217 and from the flow passage 219 to the flow passage 220.

In the valve structure using the shaft sealing device, therefore, by connecting an air supply opening and an exhaust opening of an air pressure operable actuator not shown to the flow passages 217 and 219, for example, when compressed air has been supplied from the flow passage 218 in the state of FIG. 34, it is possible to send the compressed air to a first air chamber of a cylinder not shown via the flow passage 219 and, at the same time, exhaust the compressed air from a second air chamber disposed across a piston within the cylinder via the flow passage 217 out of the flow passage 216.

In addition, when compressed air has been supplied from the flow passage 218, with the flow passages switched to the state of FIG. 35, it is possible to supply the compressed air to the second air chamber via the flow passage 217 and, at the same time, exhaust the compressed air from the first air chamber via the flow passage 219 out of the flow passage 220.

Thus, the valve structure using the shaft sealing device is used as an electromagnetic changeover valve, for example, to enable controlling the operation of the actuator and, as described above, it is possible to use the free end of the shaft sealing body as the shaft sealing portion that is brought into contact with or separated from at least two inner cylindrical annular portions (seating faces), thereby making it possible to switch the flow passages. In addition, a multiway valve can be provided through disposing two or more shaft sealing bodies within the device body.

Incidentally, in this example, since the flow passages 216, 217, 218, 219 and 220 are formed in different circumferential directions of the device body and, as a consequence, this example can be applied to all kinds of multiway valves. In addition, in each of the examples described above, the base of the shaft sealing body is attached to the holder. However, the shaft sealing body can be fixed to the device body and, also in this case, the shaft-sealed state or fluid leakage state can be obtained in the same manner as described above.

Example 1

Next, the practicability of each of the shaft sealing device and the valve structure according to the present invention was examined through the simulation of the deformation state of the shaft sealing body of the present invention by the CAE analysis. Since it was difficult to confirm the state of deformation of an actual shaft sealing body when having been expanded or contracted, an analysis of the state of deformation of a workpiece was made by the CAE analysis. The results of the analysis were substituted for the deformations of the actual shaft sealing body when having been expanded or contracted. The CAE analysis method included the steps of giving a temperature difference to between the inner and outer peripheries of the workpiece and confirming the state of deformations when having been expanded or contracted due to the temperature difference.

Figure 36:
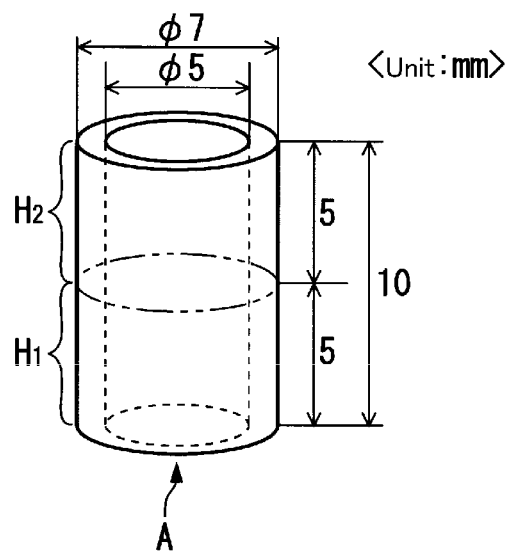
FIG. 36 is a schematic perspective view showing a workpiece used in a CAE analysis.
Figure 37:
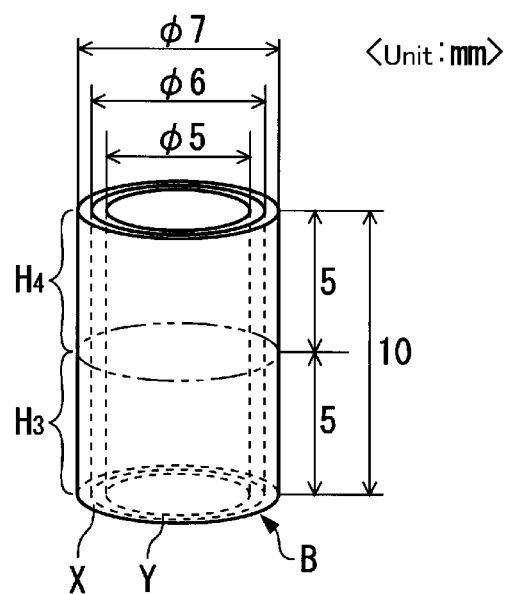
FIG. 37 is a schematic perspective view showing another workpiece used in the CAE analysis.

The workpieces used in the analysis are shown in FIGS. 36 and 37. As shown in FIG. 36, the workpiece A was a single layer of cylinder having dimensions of 7 mm in outside diameter, 5 mm in inside diameter and 10 mm in height at 24.85° C. (normal temperature) and having one end thereof constrained and the other end thereof made free, expansible and contractible. The conditions of constraint included the steps of dividing the height of 10 mm into two sections $H_1$ and $H_2$, constraining both the inner and outer peripheries of the section $H_1$ and making both the inner and outer peripheries of the section $H_2$ free. The workpiece A was used to simulate the movements of the shaft sealing body 160 formed of an ionically conductive macromolecular material as shown in FIG. 28 and make analyses through substitution of the section $H_1$ for the neighborhood of the base 166 of the shaft sealing body 160 and of the section $H_2$ for the neighborhood of the free end 167.

On the other hand, the workpiece B shown in FIG. 37 had the same dimensions as the workpiece A, was axially divided into two members X 7 mm in outside diameter (6 mm in inside diameter) and Y 6 mm in outside diameter (5 mm in inside diameter) and integrally combining the two members X and Y together. At that time, a heat-insulating layer 0.1 mm in thickness not shown was allowed to intervene between the members X and Y in order to prevent heat transfer between the respective members. The conditions of constraint of the workpiece B included the steps of dividing the height of 10 mm into two sections $H_3$ and $H_4$, constraining both the inner and outer peripheries of the section $H_3$ and making both the inner and outer peripheries of the section $H_4$ free, similarly to the case of the workpiece A. The workpiece B was used to simulate the movements of the shaft sealing body 160 of FIG. 28 formed of an electro stimuli-responsive macromolecular material or an electroconductive macromolecular material in the case of using the separator 169, allow the shaft sealing body 160 to serve as the member Y and the separator 169 to serve as the member X and make analyses through the substitution of the section $H_3$ for the neighborhood of the base 166 and the section $H_4$ for the neighborhood of the free end 167.

The material for each workpiece might have an appropriate linear coefficient of expansion and, when it was TFE (tetrafluoroethylene), for example, the linear coefficient of expansion thereof was $79.0 \times 10^{-5}$/° C. at 20° C., $20.0 \times 10^{-5}$/° C. at 0° C., $16.0 \times 10^{-5}$/° C. at 30° C., $12.4 \times 10^{-5}$/° C. at 50° C. and $13.5 \times 10^{-5}$/° C. at −50° C., for example. As the linear coefficient of expansion thereof at a set temperature having no temperature value, the value obtained by the regression calculation was adopted. In addition, the Poisson ratio of each workpiece before and after the deformation thereof was set to be 0.46.

The temperatures set for sections during heat transfer to the workpiece A are shown in Table 1. At that time, the inner periphery of the workpiece A was expressed as the inner avoiding surface on the inner periphery and the outer periphery thereof as the outer avoiding surface on the outer periphery, and the combinations of the temperatures on these surfaces were as shown in the table.

TABLE 1

| No. | Inner avoiding surface on inner periphery | Outer avoiding surface on outer periphery |
|---|---|---|
| Set Temperature (° C.) 1 | 0 | 0 |
| 2 | −20 | +20 |
| 3 | −40 | +40 |
| 4 | +20 | −20 |
| 5 | +40 | −40 |

The temperatures set for sections during heat transfer to the workpiece B are shown in Table 2. The entire members X and Y of the workpiece B were give temperatures, respectively. This was because the state of deformations made by giving relative temperature differences to the inner and outer peripheries of the workpiece B was substituted for the state of deformations of the shaft sealing body and the separator in the shaft sealing body having the separator attached thereto.

TABLE 2

| No. | Entire member X | Entire member Y |
|---|---|---|
| Set temperature (° C.) 6 | 0 | 0 |
| 7 | −20 | +20 |
| 8 | −40 | +40 |
| 9 | +20 | −20 |
| 10 | +40 | −40 |

Figure 38:
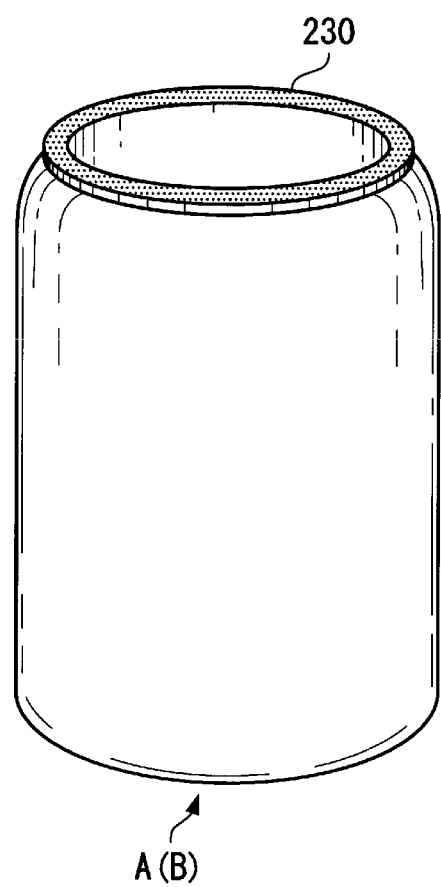
FIG. 38 is a schematic view showing one example of the workpiece deformed in shape in consequence of the CAE analysis.

The state of each of the workpieces A and B was, as shown in the schematic view of FIG. 38 when the inner periphery was set at low temperatures (minus temperatures) and the outer periphery at high temperatures (plus temperatures), such that a distal end (free end) 230 of each workpiece had a diameter shape contracted more in proportion as it went toward the distal end side while maintaining a shape of a substantially perfect circle. At that time, that tendency was further strengthened in the case where the temperature difference between the inner and outer peripheries became larger.

For example, the maximum amount of deformation (the amount of contraction in diameter) of the free end in set temperature No. 2 of the workpiece A became 0.008 mm at the inside diameter side, and that of the free end in set temperature No. 3 having a larger temperature difference became 0.015 mm. In addition, the maximum amount of deformation of the free end in set temperature No. 7 of the workpiece B became 0.008 mm, and that of the free end in set temperature No. 8 having a larger temperature difference became 0.013 mm.

Figure 39:
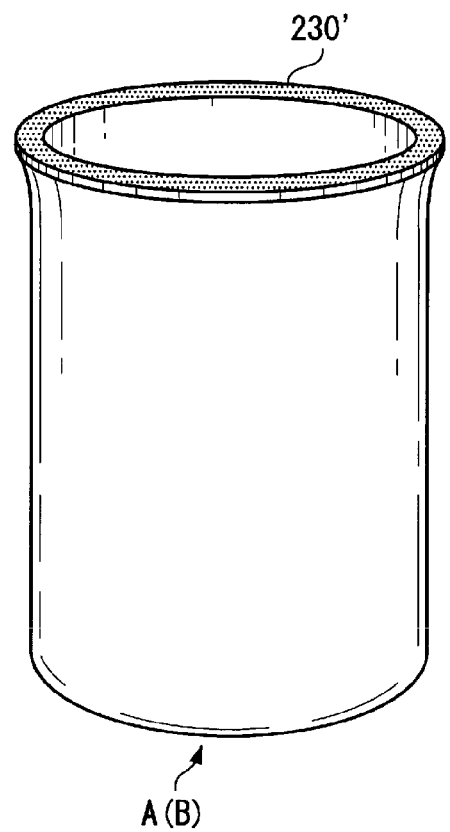
FIG. 39 a schematic view showing another example of the workpiece deformed in shape in consequence of the CAE analysis.

On the other hand, when the inner periphery of each of the workpieces A and B was set at high temperatures (plus temperatures) and the outer periphery thereof at low temperatures (minus temperatures), as shown in the schematic view of FIG. 39, a distal end 230' of each workpiece assumed a diameter shape expanded more in proportion as it went toward the distal (upper) end side, i.e. a shape substantially widening toward the end. Also in that case, hat tendency was further strengthened when the temperature difference between the inner and outer peripheries became larger.

For example, the maximum amount of deformation (the amount of expansion in diameter) of the free end in set temperature No. 4 of the workpiece A became 0.010 mm at the outside diameter side, and that of the free end in set temperature No. 5 having a larger temperature difference between the inner and outer peripheries became 0.015 mm. In addition, the maximum amount of deformation of the free end in set temperature No. 9 of the workpiece B became 0.008 mm, and that of the free end in set temperature No. 10 having a larger temperature difference became 0.013 mm.

As described above, obtained were analysis results in either the workpiece A or the workpiece B that by making the temperature on the inner periphery lower than on the outer periphery, the distal end of the work could uniformly be reduced in diameter in the shape of a substantially perfect circle and that by changing the temperature difference states on the inner and outer peripheries, i.e. making the temperature on the inner periphery higher than on the outer periphery, free end (distal end) of the workpiece could uniformly be enlarged in diameter in the shape of a substantially perfect circle. When the analysis results were applied to the shaft sealing body of the above embodiment, by applying voltages of opposite polarities to the front and back surfaces of the shaft sealing body, it could be said that the shape was changed by expansion or contraction, or deformation, while maintaining a cross-sectional shape of a perfect circle. Thus, by simulating, through the CAE analysis, the state of change of the shaft sealing body at the time external electro stimuli were applied, it could be verified that the shaft sealing body was a suitable material for the shaft sealing structure and the valve structure according to the present invention.

Example 2

Figure 40:
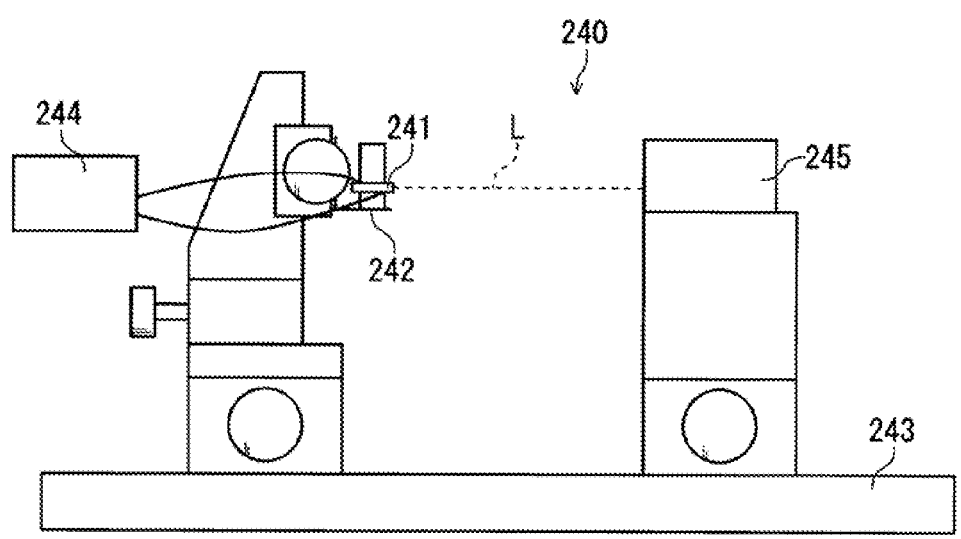
FIG. 40 is a schematic view showing a displacement measuring device.

Subsequently, in order to confirm whether the deformation mode of an electro stimuli-responsive macromolecular material having a section, other than a section to which external electro stimuli were applied, deformed was applicable to the shaft sealing device, predetermined voltage was applied and the resultant amount of displacement was measured. This measurement was performed using a displacement measurement device 240 shown in FIG. 40.

The displacement measurement device 240 has a movable stand 242 for fixing a measured body (a gel sheet sold under the trade name Hitohada (registered trademark) and product code H0-1) 241 and a stage 243 capable of moving the stand 242. In addition, a high-voltage power supply (sold under the type of HJPQ-30P1 and manufactured by Matsusada Precision Inc.) 244 is connected to fixed electrodes not shown for clamping the measured body 241 to enable the application of voltage to the measured body 241. A laser displacement gauge (sold under the type of LJ-G080 and manufactured by Keyence Corporation) 245 irradiates the measured body 241 with a laser L to enable the measurement of the amount of bending displacement of the measured body 241.

First, before the measurement, the measured body 241 was clamped by the fixed electrodes of the displacement measurement device 240 and fixed to the stand 242. In addition, the movable stage 243 was used to adjust the distance between the measured body 241 and the laser displacement gauge 245.

The high-voltage power supply 244 was operated, with the above state maintained, to stepwise increase the voltage from 0 V to 7 kV by 1 kV per 20 sec. to be applied to the measured body 241 as shown in FIG. 41(*a*) and, during the operation, the amount ∈ of bending displacement of the measured body 241 was measured with the laser displacement gauge 245. FIG. 41(*b*) shows the states of a current under the application of the voltage.

FIG. 42 shows the movement of the measured body at the time of applying voltage. As shown in FIG. 42(*a*), the measured body 241 was bent and deformed from the foot thereof toward a negative electrode by the application of voltage and, at that time, the distance from an end face 241*a* of the measured body 241 when no voltage (0 V) was applied to a corner 241*b* thereof when voltage was applied was defined as the amount ∈ of displacement. The transition of the amount ∈ of displacement is shown by a graph in FIG. 41(c).

The displacement of the measured body 241 was confirmed from FIG. 41 when the voltage applied reached 4 kV. Furthermore, when the applied voltage reached 7 kV, the amount ∈ of displacement was about 1.15 mm that was the maximum value. In addition, when the applied voltage was decreased from the state of 7 kV to the state of no voltage (0 V), it was confirmed that the measured body 241 was returned to the initial shape (before the voltage was applied).

It was confirmed from the above measurement results that the electro stimuli-responsive macromolecular material of which the measured body 241 was formed was suitable for use in the shaft sealing device of the present invention because the maximum amount of deformation thereof under the above conditions was 1.15 mm that was a large value. In that case, the measured body 241 was bent toward the negative electrode when the voltage was applied thereto. When turning over the polarity, however, it was confirmed that the bending direction was reversed (toward the positive electrode). In actual use, therefore, the measured body can be bent in a desired bending direction through adoption of the condition described above. In addition, in the above case, since the measured body 241 is bent and deformed at the time of the application of voltage to form a gap by the amounts of deformation, the electro stimuli-responsive macromolecular material is utilized to constitute an NC seal device. Furthermore, an NO seal device can be constituted by beforehand setting that the electro stimuli-responsive macromolecular material is molded into a bent shape in an initial state and deformed into a plane shape when voltage has been applied.

The invention claimed is:

1. A drive apparatus using a shaft sealing device, comprising:
    a cylinder portion with a piston, the piston having a first side and a second side;
    first and second supply and discharge leakage flow passages arranged so as to communicate with first side and the second side of the piston in the cylinder portion;
    a housing communicating with the first and second supply and discharge leakage flow passages, and having first, second, third and fourth shaft sealing bodies comprising a plurality of dielectric elastomers configured to be switchable between air flow passages accommodated therein;
    first and second discharge leakage flow passages configured to discharge compressed air within the housing to outside the housing; and
    a supply leakage flow passage configured to supply compressed air into the housing;
    wherein each of the shaft sealing bodies is configured to return to an original position when application of external electro stimuli is stopped, thereby heightening shaft sealing power, and the shaft sealing bodies are configured to have a section thereof, other than a section thereof to which the external electro stimuli has been applied, be deformed, thereby inducing an appropriate leakage phenomenon due to a decrease in shaft sealing power.

2. The shaft sealing device according to claim 1, further comprising a holder configured to retain each of the shaft sealing bodies on a retaining surface thereof from upper and lower directions, and electrodes disposed on the retaining surface of each of the holders and which are electrically connected to an exterior of the device body.

3. The shaft sealing device according to claim 1, wherein each of the shaft sealing bodies includes electrodes connected to an exterior of the device body when being clamped by upper and lower surfaces of the shaft sealing body.

4. The shaft sealing device according to claim 1, wherein the appropriate leakage phenomenon includes minute leakage.

5. A drive apparatus using a shaft sealing device, comprising:
    a cylinder portion with a piston, the piston having a first side and a second side;
    first and second supply and discharge leakage flow passages communicating with the first side and the second side of the piston in a cylinder portion;
    a housing communicating with the first and second supply and discharge leakage flow passages, and having first, second, third and fourth shaft sealing bodies comprising a plurality of dielectric elastomers configured to be switchable between air flow passages accommodated therein;
    first and second discharge leakage flow passages configured to discharge compressed air within the hosing to outside the housing; and
    a supply leakage flow passages configured to supply compressed air into the housing;
    wherein each of the shaft sealing bodies has a section thereof that deforms, when external electro stimuli has been applied to a section thereof, other than the section thereof to which the external electro stimuli has been applied, thereby heightening shaft sealing power, wherein each of the shaft sealing bodies is returned to an original position from being deformed when application of the external electro stimuli has been stopped, thereby inducing an appropriate leakage phenomenon due to a decrease in shaft sealing power.

\* \* \* \* \*